(12) United States Patent
Lee et al.

(10) Patent No.: US 11,974,401 B2
(45) Date of Patent: Apr. 30, 2024

(54) ELECTRONIC DEVICE INCLUDING ANTENNA CONNECTING STRUCTURE INCLUDING FLEXIBLE PRINTED CIRCUIT BOARD

(71) Applicant: Samsung Electronics Co., Ltd., Suwon-si (KR)

(72) Inventors: Sunghyup Lee, Suwon-si (KR); Chongo Yoon, Suwon-si (KR); Kwonho Son, Suwon-si (KR); Mincheol Seo, Suwon-si (KR); Yoonjung Kim, Suwon-si (KR); Hyungjin Kim, Suwon-si (KR); Jungsik Park, Suwon-si (KR); Sangyoup Seok, Suwon-si (KR); Donghun Shin, Suwon-si (KR); Seongyong An, Suwon-si (KR); Kyungjae Lee, Suwon-si (KR); Heeseok Jung, Suwon-si (KR); Huiwon Cho, Suwon-si (KR); Hyunju Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 17/643,003

(22) Filed: Dec. 7, 2021

(65) Prior Publication Data
US 2022/0174821 A1 Jun. 2, 2022

Related U.S. Application Data

(63) Continuation of application No. PCT/KR2021/017353, filed on Nov. 24, 2021.

(30) Foreign Application Priority Data

Dec. 2, 2020 (KR) .......................... 10-2020-0166661

(51) Int. Cl.
*H05K 1/02* (2006.01)
*H01Q 1/36* (2006.01)
(Continued)

(52) U.S. Cl.
CPC ............. *H05K 1/189* (2013.01); *H05K 1/118* (2013.01); *H05K 1/141* (2013.01); *H05K 1/147* (2013.01);
(Continued)

(58) Field of Classification Search
CPC ........ H05K 1/02; H05K 1/028; H05K 1/0281; H05K 1/118; H05K 1/141; H05K 1/147;
(Continued)

(56) References Cited

U.S. PATENT DOCUMENTS 8,836,587 B2 9/2014 Darnell et al.
9,287,627 B2 3/2016 Jarvis et al.
(Continued)

FOREIGN PATENT DOCUMENTS

KR 10-1313089 9/2013
KR 10-2013-0118919 10/2013
(Continued)

OTHER PUBLICATIONS

Search Report and Written Opinion dated Mar. 4, 2022 in counterpart International Patent Application No. PCT/KR2021/017353.

*Primary Examiner* — Xiaoliang Chen
(74) *Attorney, Agent, or Firm* — Nixon & Vanderhye, P.C.

(57) ABSTRACT

An electronic device according to various embodiments may include: a first frame at least partially exposed to an outside of the electronic device and comprising a metal material, a flexible printed circuit board at least a portion of which is disposed adjacent to the first frame, a first connector electrically connecting the flexible printed circuit board and a (Continued)

main board of the electronic device, a bendable second connector electrically connecting the flexible printed circuit board and the first frame, a bolt including a bolt body extending through a groove formed in the second connector to be bolt-coupled to a bolt groove formed in the first frame and a bolt head formed integrally with the bolt body and disposed in a first direction with respect to the first frame, a plate disposed adjacent to the bolt head of the bolt and coupled to the first frame in the first direction to allow the bolt body of the bolt to be maintained in a state of being coupled to the bolt groove formed in the first frame, and an integrated circuit disposed on the flexible printed circuit board.

14 Claims, 18 Drawing Sheets

(51) Int. Cl.
*H01Q 1/48* (2006.01)
*H01Q 3/34* (2006.01)
*H01Q 3/44* (2006.01)
*H01Q 7/00* (2006.01)
*H01Q 9/42* (2006.01)
*H01Q 13/10* (2006.01)
*H01Q 21/28* (2006.01)
*H01Q 21/30* (2006.01)
*H05K 1/11* (2006.01)
*H05K 1/14* (2006.01)
*H05K 1/18* (2006.01)
*H05K 5/04* (2006.01)

(52) U.S. Cl.
CPC .............. *H05K 2201/10098* (2013.01); *H05K 2201/10189* (2013.01)

(58) Field of Classification Search
CPC .... H05K 1/189; H05K 5/0004; H05K 5/0017; H05K 5/0221; H05K 5/0226; H05K 5/0247; H05K 5/069; H01Q 1/36; H01Q 1/48; H01Q 1/243; H01Q 1/526; H01Q 3/34; H01Q 3/44; H01Q 7/00; H01Q 9/0421; H01Q 9/045; H01Q 9/42; H01Q 13/10; H01Q 21/28; H01Q 21/30
USPC ................... 361/749, 751; 343/700 MS, 702
See application file for complete search history.

(56) References Cited

U.S. PATENT DOCUMENTS

| | | | | |
|---|---|---|---|---|
| 10,461,429 | B2* | 10/2019 | Durning | H01Q 9/0421 |
| 10,854,968 | B2* | 12/2020 | Zhou | H05K 5/0017 |
| 2012/0176754 | A1* | 7/2012 | Merz | H01Q 9/0421 |
| | | | | 361/751 |
| 2013/0257659 | A1* | 10/2013 | Darnell | H05K 1/028 |
| | | | | 343/702 |
| 2015/0240924 | A1 | 8/2015 | Lee | |
| 2016/0028148 | A1 | 1/2016 | Tan et al. | |
| 2016/0072178 | A1* | 3/2016 | Khalifa | H01Q 1/36 |
| | | | | 343/702 |
| 2018/0069588 | A1 | 3/2018 | Jiang et al. | |
| 2019/0230803 | A1* | 7/2019 | Liao | H05K 5/0221 |
| 2020/0267863 | A1* | 8/2020 | Kim | H05K 5/069 |
| 2020/0344335 | A1 | 10/2020 | Lee et al. | |

FOREIGN PATENT DOCUMENTS

| | | |
|---|---|---|
| KR | 10-2014-0139520 | 12/2014 |
| KR | 10-2016-0045643 | 4/2016 |
| KR | 10-2019-0029438 | 3/2019 |
| KR | 10-2019-0087013 | 7/2019 |
| KR | 10-2020-0101143 | 8/2020 |

* cited by examiner

ELECTRONIC DEVICE INCLUDING ANTENNA CONNECTING STRUCTURE INCLUDING FLEXIBLE PRINTED CIRCUIT BOARD

CROSS-REFERENCE TO RELATED APPLICATIONS

This application is a continuation of International Application No. PCT/KR2021/017353 designating the United States, filed on Nov. 24, 2021, in the Korean Intellectual Property Receiving Office and claiming priority to Korean Patent Application No. 10-2020-0166661, filed on Dec. 2, 2020, in the Korean Intellectual Property Office, the disclosures of which are incorporated by reference herein in their entireties.

BACKGROUND

Field

The disclosure relates to an electronic device including an antenna connecting structure including a flexible printed circuit board.

Description of Related Art

There have been increasing demands for electronic devices having exterior metals applied thereto in line with design trends of portable electronic devices.

In the case of an electronic device having a first frame made of a metal material as the exterior thereof, there may be restrictions on arranging an antenna inside the first frame. As a scheme for overcoming this, the metallic first frame may be used as an antenna radiator, thereby implanting a multi-band antenna and securing the radiation performance.

Meanwhile, additional service bands may be added since the inauguration of 5G services. As a result, a larger number of antenna radiators than the prior art may be necessary.

In order to use a frame as an antenna in the case of an electronic device having a metallic frame as the exterior, the integrated circuit and the frame need to be electrically connected. The integrated circuit may be disposed on a conventional printed circuit board. Therefore, in order to connect the integrated circuit and the frame, it is customary to expand the printed circuit board to the inside of the frame and to connect the frame and the printed circuit.

High-speed transmission of a large amount of data requires application of a technology such as multi input multi output (MIMO), carrier aggregation (CA), or e-utran new radio dual connectivity (ENDC), and an increased number of antennas are needed to implement the same. This increases the number of antennas connected to the metallic first frame. The expanded area of the printed circuit board increases so as to be connected to the increased number of antennas, and such extension is also limited by the limited inner space of the electronic device.

SUMMARY

Embodiments of the disclosure may provide an antenna connecting structure configured such that the inner space of an electronic device can be utilized effectively, and an electronic device including an antenna connecting structure.

An electronic device according to various example embodiments may include: a first frame at least partially exposed to the outside of the electronic device and comprising a metal material, a flexible printed circuit board at least a portion of which is disposed adjacent to the first frame, a first connector electrically connecting the flexible printed circuit board and a main board of the electronic device, a bendable second connector electrically connecting the flexible printed circuit board and the first frame, a bolt including a bolt body extending through a groove formed in the second connector to be bolt-coupled to a bolt groove formed in the first frame and a bolt head formed integrally with the bolt body and disposed in a first direction with respect to the first frame, a plate disposed adjacent to the bolt head of the bolt and coupled to the first frame in the first direction to allow the bolt body of the bolt to be maintained in a state of being coupled to the bolt groove formed in the first frame, and an integrated circuit disposed on the flexible printed circuit board.

According to various example embodiments, an antenna connecting structure including integrated circuit connected to a metallic first frame may be effectively arranged inside a narrow space of an electronic device.

In addition, the antenna connecting structure may be stably fixed inside the electronic device.

BRIEF DESCRIPTION OF THE DRAWINGS

In connection with the description of the drawings, the same or similar reference numerals may be used for the same or similar components. The above and other aspects, features and advantages of certain embodiments of the present disclosure will be more apparent from the following detailed description, taken in conjunction with the accompanying drawings, in which.

DETAILED DESCRIPTION

Figure 1:
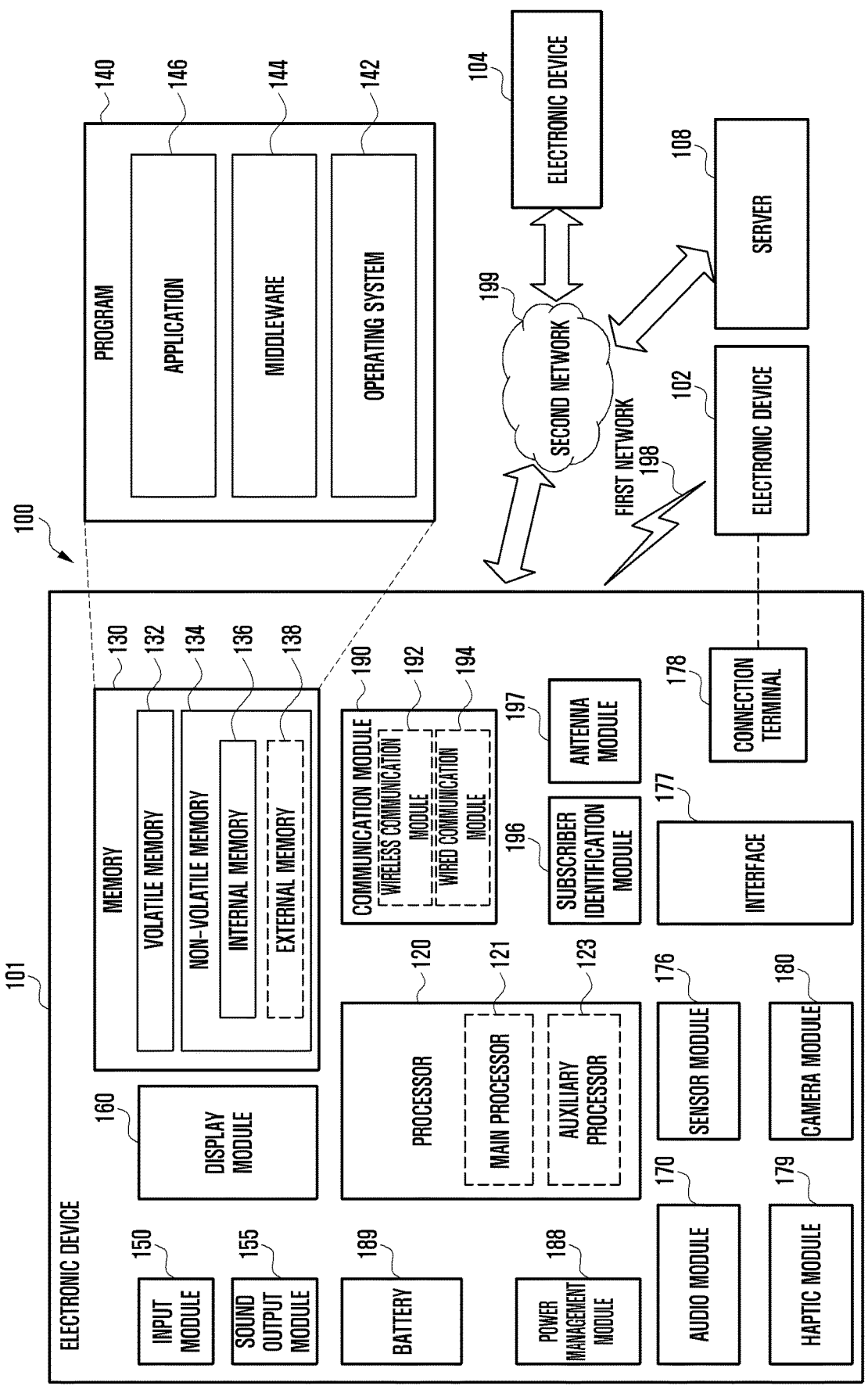
FIG. 1 is a block diagram illustrating an example electronic device in a network environment according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beamforming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
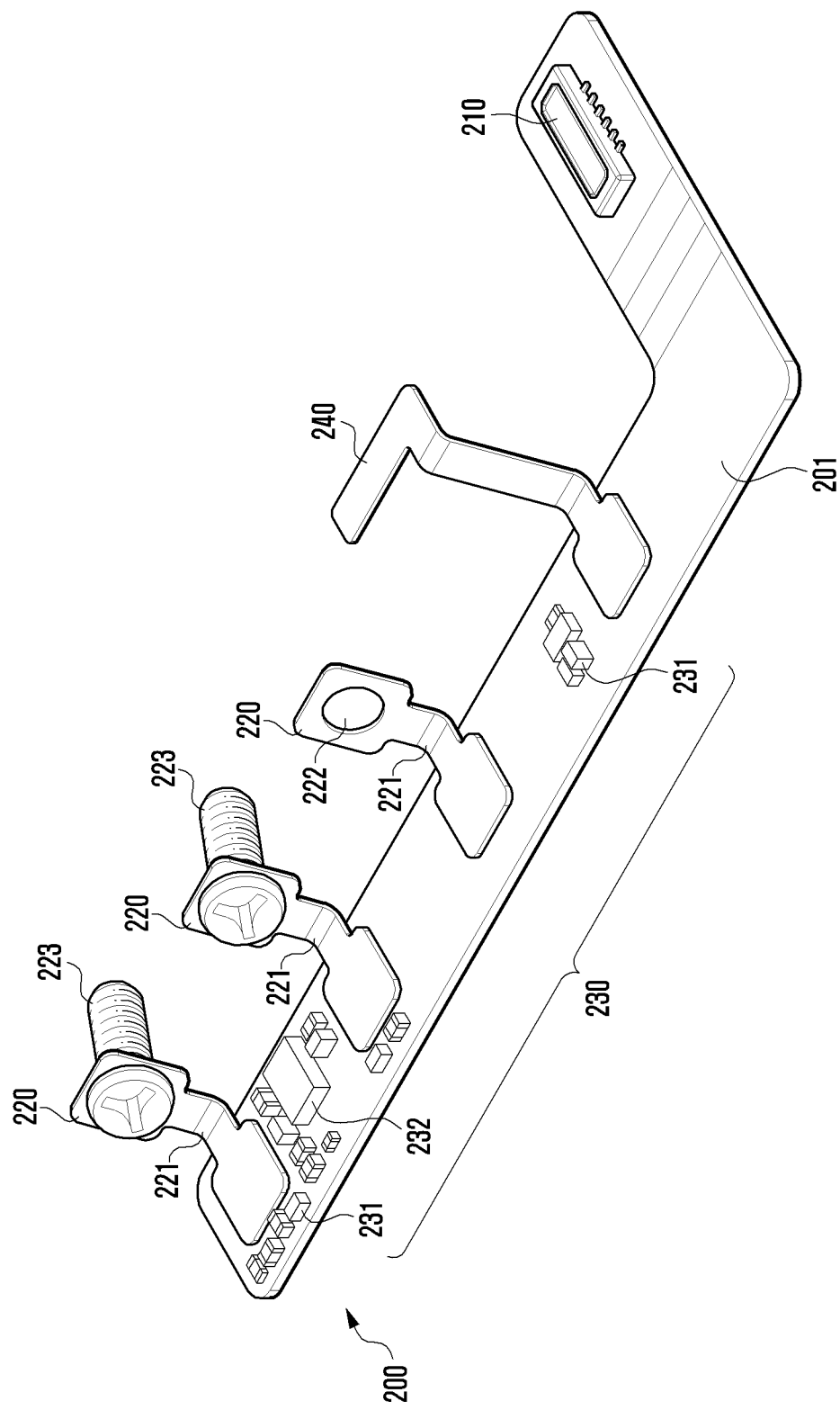
FIG. 2 is a perspective view of an antenna connecting structure according to various embodiments.

FIG. 2 is a perspective view illustrating an example antenna connecting structure according to various embodiments.

The antenna connecting structure 200 according to various embodiments disclosed herein may include a flexible printed circuit board (FPCB) 201, a first connector 210, a second connector 220, and an integrated circuit 230. A component of the antenna connecting structure 200 described above is merely an example, and one of the described components may be omitted or another component except the described components may be included in the antenna connecting structure 200.

According to various embodiments, the flexible printed circuit board 201 may be a board formed of a flexible material and having a signal line (e.g., a signal line 410 in FIG. 4A) disposed thereon. The flexible printed circuit board 201 can be disposed in a narrow space, unlike a general printed circuit board formed of a less flexible material, and have a high degree of freedom of manufacturing in terms of a shape. Therefore, the flexible printed circuit board 201 can have an advantage of being disposed in a narrow space inside an electronic device. For example, the flexible printed circuit board 201 may be manufactured in a shape in which the flexible printed circuit board can be disposed in a space between electronic components or instruments disposed in an electronic device. The flexible printed circuit board 201 may be bent and thus may be disposed on a surface having a stepped portion. The flexible printed circuit board 201 may be a base of the antenna connecting structure 200 disclosed herein, and thus various components may be coupled or connected to the flexible printed circuit board 201.

According to various embodiments, the flexible printed circuit board 201 may be a flexible PCB RF cable (FRC). For example, the flexible printed circuit board 201 may transmit a high frequency signal.

According to various embodiments, a signal line (e.g., the signal line 410 in FIG. 4A) for transmitting a radio frequency (RF) signal may be disposed in the flexible printed circuit board 201. A ground via (e.g., a ground via 420 in FIG. 4A) may be disposed around the signal line. In a flexible printed circuit board formed by stacking a plurality of layers, the ground via may include a structure in which grounds arranged on different layers are connected in a stacked direction. For example, when the flexible printed circuit board 201 includes a plurality of layers (e.g., the flexible printed circuit board 400A and 400B in FIG. 4A), a ground disposed on the same layer as the signal line may be disposed around the signal line and a ground disposed on a different layer to the signal line may be disposed in a position overlapping the signal line. The grounds disposed on different layers may be connected to each other in the form of vias. An RF signal generated by a communication module (e.g., a communication module 190 in FIG. 1) electrically connected to the flexible printed circuit board 201 may be transmitted through the signal line and the received RF signal may be transmitted through the antenna. The detailed descriptions of the signal line and the ground via will be described in greater detail below (see description in FIG. 4A).

According to various embodiments, the first connector 210 may electrically connect the flexible printed circuit board 201 and a main board (e.g., a main board 302 in FIG. 3C) of the electronic device. The main board of the electronic device may include a board having a communication module disposed thereon, or a board electrically connected to the board having a communication module disposed thereon. The first connector 210 may electrically connect the flexible printed circuit board 201 and the main board in various ways. The first connector 210 may connect the flexible printed circuit board 201 and the main board using an electrically connecting method, such as soldering, clipping, socketing, bolting, and/or bonding. For example, the first connector 210 may be a connector having a form in which a socket can be inserted, as illustrated in FIG. 2. The RF signal generated by the communication module disposed in the main board may be transmitted to the flexible printed circuit board 201 through the first connector 210.

According to various embodiments, the second connector 220 may electrically connect the flexible printed circuit board 201 and a first frame (e.g., a first frame 304 in FIG. 3C) of the electronic device. At least a portion of the first frame of the electronic device may be exposed to the outside of the electronic device and may be formed of a metal material. The first frame formed of a metal material may function as an antenna for transmitting or receiving an RF signal. The second connector 220 may include a bent part 221 which is a part may be bent. The second connector 220 including the bent part 221 may be partially deformed depending on an arrangement relation between the first frame and the flexible printed circuit board 201. The first frame and the flexible printed circuit board 201 may be connected to each other by the second connector 220 in the form where a portion thereof can be deformed, thereby improving the degree of freedom of an arrangement of the flexible printed circuit board 201.

According to various embodiments, the second connector 220 and the first frame may be electrically connected to each other in various ways. The second connector 220 may be connected the first frame using an electrically connecting method, such as soldering, clipping, socketing, and bolting. For example, the second connector 220 may include a screw hole 222 in which a bolt 223 can be inserted, as illustrated in FIG. 2. The bolt 223 may be inserted in the screw hole 222 and screw-coupled to the first frame, and thus the second connector 220 can be electrically connected to the first frame. Even when an impact is applied thereto from the outside of the electronic device, the coupled state of the second connector 220 and the flexible printed circuit board 201 may be stably maintained. The second connector 220 and the flexible printed circuit board 201 may be electrically connected to each other in various ways. The second connector 220 may be connected to the flexible printed circuit board 201 using an electrically connecting method, such as soldering, clipping, socketing, bolting, and/or bonding. For example, the second connector 220 may be electrically connected to the flexible printed circuit board 201 through the soldering. The RF signal transmitted to the flexible printed circuit board 201 may be transmitted to the first frame through the second connector 220. The RF signal transmitted to the first frame may be transmitted to the flexible printed circuit board 201 through the second connector 220.

According to various embodiments, there may be the plurality of second connectors 220, as illustrated in FIG. 2. The plurality of the second connectors 220 may be respectively connected to the first frame (e.g., a first sub-frame 304A and a second sub-frame 304B in FIG. 3B) segmented by an insulating material (e.g., an insulating material 305 in FIG. 3B). Further, the plurality of second connectors 220 may be connected to one first frame which is not segmented.

According to various embodiments, the plurality of second connectors 220 may be connected to the first frame or the ground of the electronic device. The first frame can function as an antenna, and thus the second connector 220 connected to the first frame can transmit the RF signal to the first frame. The length of the antenna connected to the second connector 220 may be increased or decreased using software or hardware by the integrated circuit 230 described in greater detail below. The increasing or decreasing in the length of the antenna using hardware may refer, for example, to a switching circuit 232 included in the integrated circuit 230 electrically connecting the segmented antennas to each other. The ground of the electronic device may refer, for example, to one of inner frames of the electronic device, or a ground terminal provided on the printed circuit board included in the electronic device. At least one of the second connectors 220 may be connected to the first frame and at least one thereof may be connected to the ground, and thus the antenna may be a planar inverted f antenna (PIFA).

According to various embodiments, the integrated circuit 230 may be disposed on the flexible printed circuit board 201. The integrated circuit 230 may include, for example, various antenna-related circuit such as a matching circuit 231 for impedance matching and a switching circuit 232 for allowing the antenna connecting structure 200 to correspond to wideband characteristics. For example, the switching circuit 232 short-circuits (short) the antennas electrically opened to each other to increase the physical length of the antenna. The matching circuit 231 which may be included in the integrated circuit 230 may be disposed on the flexible printed circuit board 201 adjacent to the first frame for performing an antenna function in the electronic device. Since the matching circuit 231 is disposed at the position adjacent to the first frame, the loss of the RF signal can be reduced. In an embodiment, the switching circuit 232 may be a tuner.

It is understood that the matching circuit 231 and the switching circuit 232 of the integrated circuit 230 described above are not limited to the functions indicated by their names but include a circuit including an element which can perform the corresponding function. For example, the switching circuit 232 may be called a switching circuit unit 232 and the matching circuit 231 may be called a variable element unit 231.

According to various embodiments, the integrated circuit 230 may include a radio frequency integrated circuit (RF IC). For example, the integrated circuit 230 may include a circuit operating in a frequency range suitable for wireless transmission. For example, the integrated circuit 230 may include a power amp, a low noise amp, a phase shifter, and/or a phase detector.

According to various embodiments, the flexible printed circuit board 201 may include a conductive material and may include at least one additional antenna 240 electrically connected to the flexible printed circuit board 201. This additional antenna 240 may be, for example, an antenna for transmitting or receiving a high-frequency RF signal (Ghz frequency or higher). Even when the additional antenna 240 for transmitting or receiving the high-frequency RF signal is disposed in the inner side of the first frame formed of a metal material, the influence on the performance of the additional antenna 240 may be low. Accordingly, the additional antenna 240 may be disposed in the inner side of the first frame. In some cases, a part of the additional antenna 240 connected to the flexible printed circuit board 201 may be exposed to the outside of the electronic device. The matching circuit 231 may be disposed at the position adjacent to the additional antenna 240.

Figure 3A:
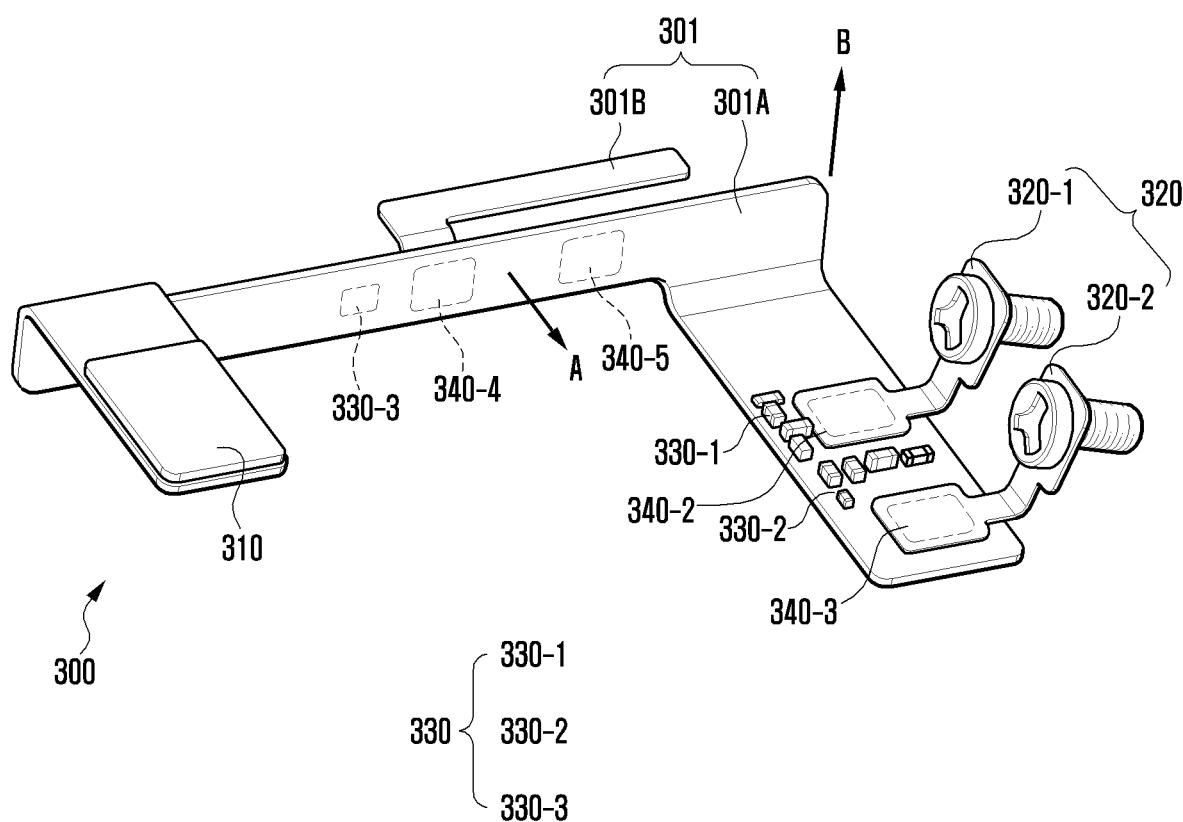
FIG. 3A is a perspective view of an antenna connecting structure according to various embodiments.
Figure 3B:
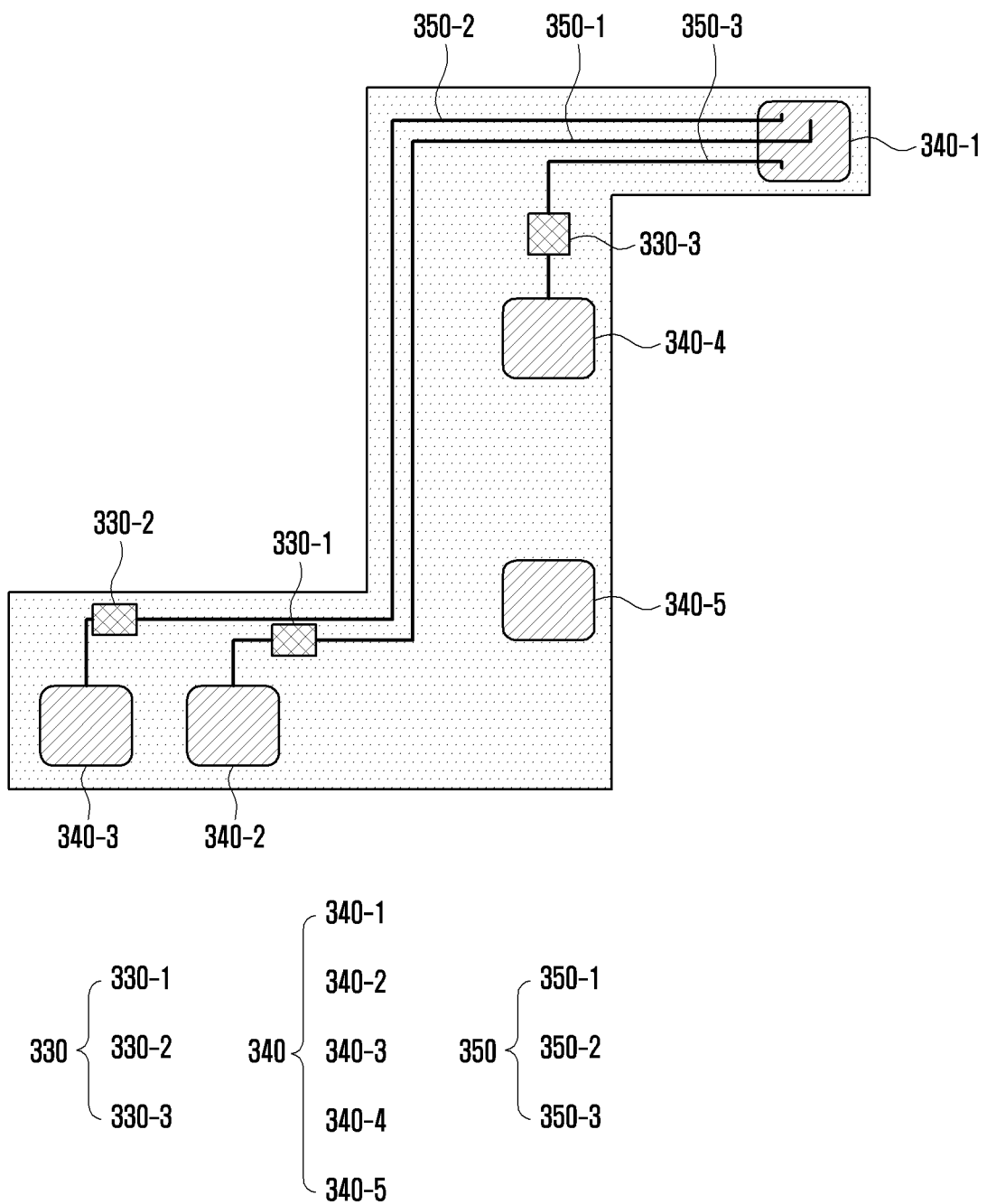
FIG. 3B is a diagram illustrating an electrical connection relation of the antenna connecting structure illustrated in FIG. 3A according to various embodiments.
Figure 3C:
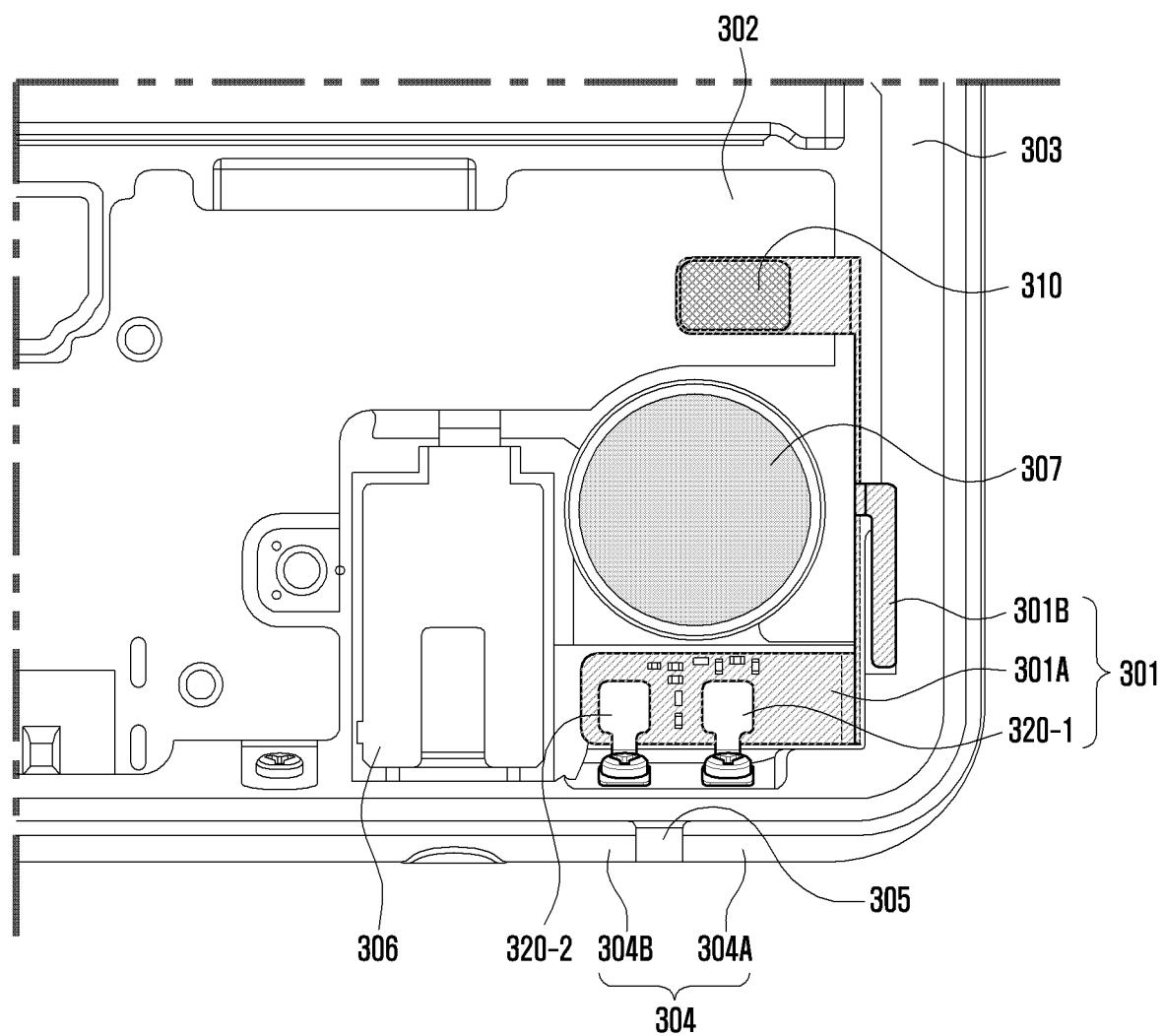
FIG. 3C is a diagram illustrating a state in which the antenna connecting structure illustrated in FIG. 3A is disposed in an electronic device according to various embodiments.
Figure 3D:
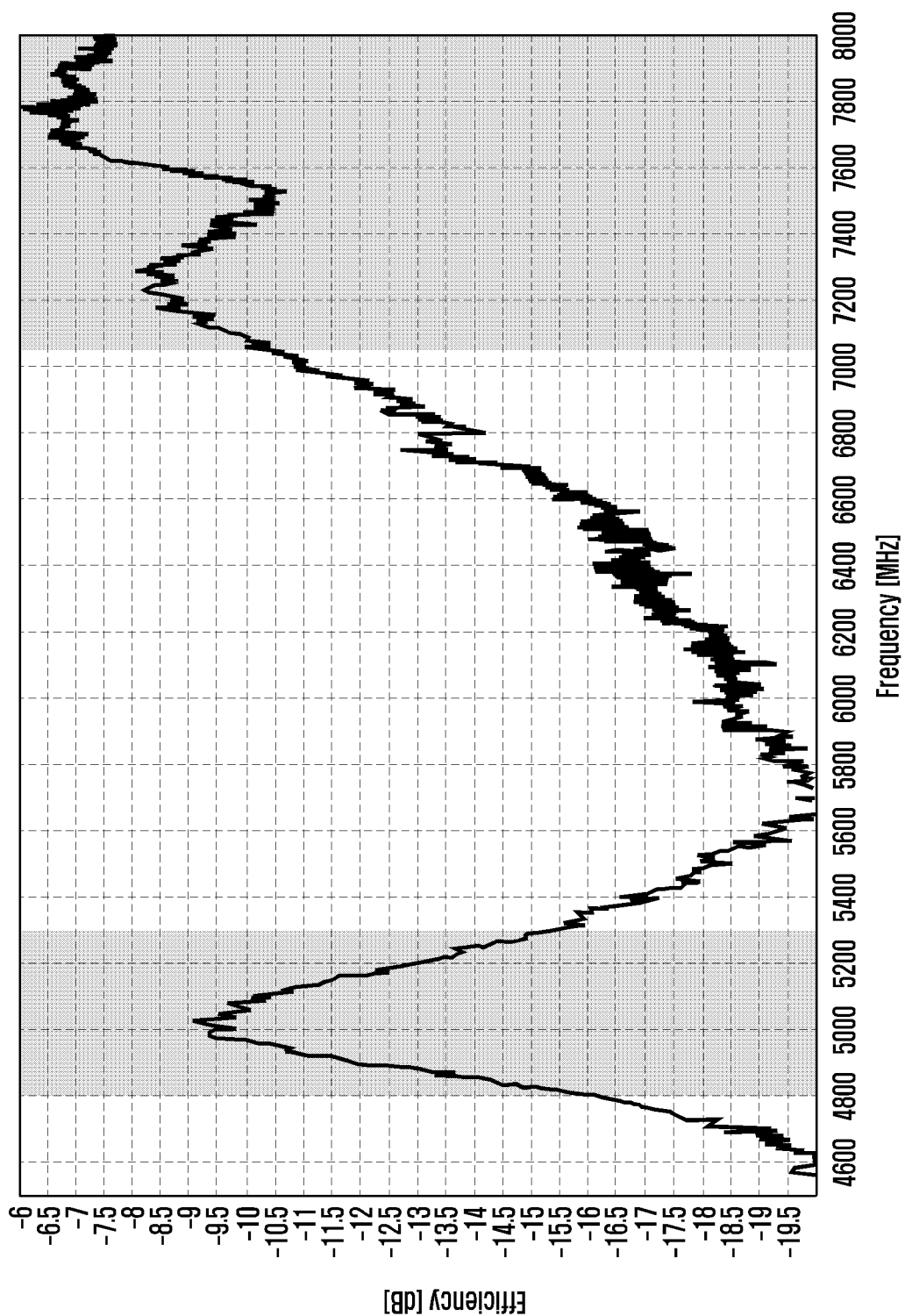
FIG. 3D is a graph illustrating the performance of an additional antenna illustrated in FIG. 3A according to various embodiments.

FIG. 3A is a perspective view illustrating an example antenna connecting structure according to various embodiments. FIG. 3B is a diagram illustrating an electrical connection relation of the antenna connecting structure illustrated in FIG. 3A according to various embodiments. FIG. 3C is a diagram illustrating a state in which the antenna connecting structure illustrated in FIG. 3A is disposed in an electronic device according to various embodiments. FIG. 3D is a graph illustrating the performance of an additional antenna illustrated in FIG. 3A according to various embodiments.

The antenna connecting structure 300 illustrated in FIG. 3A may be an embodiment of the antenna connecting structure 200 illustrated in FIG. 2. The detailed description of the configuration identical or similar to the antenna connecting structure 300 described above may not be repeated here and the different points will be mainly described.

According to various embodiments, the antenna connecting structure 300 may include a flexible printed circuit board 301, a first connector 310, a second connector 320, and an integrated circuit 330

According to various embodiments, the flexible printed circuit board 301 may include a first area 301A and a second area 301B branched and extending from the first area 301A. The flexible printed circuit board 301 may be partially deformed (e.g., bent) to be efficiently disposed in the electronic device. For example, the flexible printed circuit board 301 may be bent such that a portion of the flexible printed circuit board 301 is oriented in a first direction A and a portion of the flexible printed circuit board 301 is oriented in a second direction B different from the first direction A. The flexible printed circuit board 301 may include a surfacing in a first direction A and a surface facing in a second direction B.

According to various embodiments, the integrated circuit 330 may include, for example, various antenna-related circuits such as a matching circuit (e.g., the matching circuit 231 in FIG. 2) for impedance matching and a switching circuit (e.g., the switching circuit 232 in FIG. 2) for allowing the antenna connecting structure 300 to correspond to wideband characteristics. For example, the switching circuit short-circuits the antennas electrically opened to each other to increase the physical length of the antenna. The integrated circuit 330 may include a first circuit 330-1, a second circuit 330-2, and a third circuit 330-3. For example, the first circuit 330-1 may be disposed at the position adjacent to a 2A-th connector 320-1, and the second circuit 330-2 may be disposed at the position adjacent to a 2B-th connector 320-2, and the third circuit 330-3 may be disposed at the position adjacent to an antenna radiator 301B. The integrated circuit 330 may be disposed to be adjacent to the component for transmitting or receiving a signal (e.g., the first frame 304, and the antenna radiator 301B) so that the loss of an RF signal may be reduced. The arrangement and the number of the integrated circuit 330 may be variously changed.

According to various embodiments, when the 2A-th connector 320-1 and the 2B-th connector 320-2 are connected to one frame (the first sub-frame 304A or the second sub-frame 304B) which is not segmented, the entire length of the antenna may be changed in a manner that the second circuit 330-2 and/or the third circuit 330-3 connects one of the 2A-th connector 320-1 or the 2B-th connector 320-2 to the frame. The 2A-th connector 320-1 may be connected to the frame to transmit the RF signal, and the 2B-th connector 320-2 may be connected to the ground.

According to various embodiments, a plurality of pads 340 may be disposed on the flexible printed circuit board 301 using a printing method. For example, as illustrated in FIG. 3B, a first pad 340-1 may be electrically connected to the first connector 310, a second pad 340-2 may be electrically connected to the 2A-th connector 320-1, a third pad 340-3 may be electrically connected to the 2B-th connector 320-2, a fourth pad 340-4 may be electrically connected to the antenna radiator 301B, and a fifth pad 340-5 may be electrically connected to the ground of the flexible printed circuit board 301. The fifth pad 340-5 may be electrically connected to the ground of the electronic device by a separate connecting member (not illustrated). The connecting member for electrically connecting the fifth pad 340-5 and the ground of the electronic device may have a similar form to the second connector 320 in FIG. 3A. In an embodiment, the second pad 340-2 may be electrically connected to the first circuit 330-1, the third pad 340-3 may be electrically connected to the second circuit 330-2, and the fourth pad 340-4 may be electrically connected to the third circuit 330-3.

According to various embodiments, a transmission line 350 may be disposed on the flexible printed circuit board 301. The transmission line 350 may transmit a communication signal generated by a communication module (e.g., the communication module 190 in FIG. 1) of the electronic device or a communication signal received from the outside. The transmission line 350 may include a first line 350-1 for connecting the first pad 340-1 and the first circuit 330-1, a second line 350-2 for connecting the first pad 340-1 and the second circuit 330-2, and a third line 350-3 for connecting the first pad 340-1 and the third circuit 330-3. The ground may be disposed around the transmission line 350. The description of the transmission line 350 and the ground arrangement is provided in greater detail below with reference to FIG. 4A.

According to various embodiments, the second area 301B may operate as an antenna radiator for transmitting or receiving a high-frequency RF signal. The second area 301B may be electrically connected to the main board 302. The second area 301B may be connected to the communication module disposed on the main board 302 to transmit or receive an RF signal. In an embodiment, the second area 301B may be the same flexible printed circuit board 301 as the first area 301A. The second area 301B may have an antenna pattern disposed therein so that the second area 301B operates as an antenna radiator. As illustrated in FIG. 3C, the second area 301B of the flexible printed circuit board 301 may be at least partially supported by a second frame 303 of the electronic device at the inner side of the first frame 304 formed of a metal material. In the case of the antenna for transmitting or receiving a high-frequency signal, even when the antenna is positioned at the inner side of the first frame 304 formed of a metal material, the influence on the performance may be low. The flexible printed circuit board 301 may be partially deformed so that a portion of the flexible printed circuit board 301 may function as an antenna, as in the second area 301B illustrated in FIG. 3A. In an embodiment, the matching circuit (e.g., the matching circuit 231 in FIG. 2) which may be included in the integrated circuit 330 may be disposed to be adjacent to the point where the second area 301B is segmented from the first area 301A. Referring to FIG. 3D, it can be seen that the second area 301B functioning as an additional antenna can smoothly transmit or receive a communication signal in a band of 4800 MHz to 5200 MHz or 7000 MHz or higher. Frequencies in various bands can be transmitted or received by variously changing a resonant frequency depending on the length of the antenna pattern disposed in the second area 301B. For example, the length of the antenna pattern may be adjusted to transmit or receive a communication signal in a band of 2.4 GHz or 1.5 GHz.

According to various embodiments, at least a portion of the flexible printed circuit board 301 may be supported by the second frame 303 of the electronic device, which is disposed at the inner side of the first frame 304 formed of a metal material. The second frame 303 may support various components of the electronic device.

According to various embodiments, the flexible printed circuit board 301 may be disposed to be adjacent to the first frame 304 of the electronic device. For example, the flexible printed circuit board 301 may be disposed between the first frame 304 and the main board 302 of the electronic device. For example, the flexible printed circuit board 201 may be disposed to be further adjacent to the first frame 304 than the main board 302 of the electronic device. As illustrated in FIG. 3C, the flexible printed circuit board 301 may be disposed to avoid components (e.g., a vibration motor 307, and an earphone hole 306) of the electronic device. Since the flexible printed circuit board 301 is deformable, the flexible printed circuit board 301 may be disposed to avoid interference with another component of the electronic device at an narrow space in the electronic device. A component for an antenna function may be disposed in the flexible printed circuit board 301 so that the antenna connecting structure 300 can be disposed in a space of the electronic device, which has been difficult to be utilized in the prior art.

According to various embodiments, the first connector 310 may electrically connect the main board 302 and the flexible printed circuit board 301. The first frame 304 of the electronic device may be segmented into a plurality of areas 304A and 304B by the insulating material 305. The length of the segmented first frame 304A and 304B may be changed according to a communication frequency used in the electronic device. The long first sub-frame 304A may be used as an antenna for a relatively low-frequency communication signal and the short first frame 304B may be used as an antenna for a relatively high-frequency communication signal. For example, as illustrated in FIG. 3C, the first frame 304 may be segmented into the first sub-frame 304A and the second sub-frame 304B. A plurality of second connectors (2A-th connector 320-1 and 2B-th connector 320-2) may allow the segmented first frame 304A and 304B to be electrically connected to the flexible printed circuit board 301. Referring to FIG. 3C, the 2A-th connector 320-1 may connect the first sub-frame 304A and the flexible printed circuit board 301, and the 2B-th connector 320-2 may electrically connect the second sub-frame 304B and the flexible printed circuit board 301. A portion of the RF signals transmitted through the flexible printed circuit board 301 may be transmitted through the first sub-frame 304A, and a portion thereof may be transmitted through the second sub-frame 304B. In some cases, the first sub-frame 304A and the second sub-frame 304B may be short-circuited by the switching circuit of the integrated circuit 330. Depending on the state or the operation of the electronic device related to communication, an RF signal may be transferred to the first sub-frame 304A through the 2A-th connector 320-1 to use the first sub-frame 304A as an antenna, and an RF signal may be transferred to the second sub-frame 304B through the 2B-th connector 320-2 to use the second sub-frame 304B as an antenna. The first sub-frame 304A and the second sub-frame 304B may be used as antennas for transmitting communication signals having different bands. For example, the 2A-th connector 320-1 may transmit a signal to the first sub-frame 304A to allow a low-band or mid-band RF signal to be transmitted to the first sub-frame 304A. The 2B-th connector 320-2 may transmit a signal to the second sub-frame 304B to allow a high-band RF signal to be transmitted to the second sub-frame 304B. A communication signal can be transmitted in various ways through the first sub-frame 304A and the second sub-frame 304B which are short-circuited to each other.

It is described above that the antenna connecting structure 300 includes the flexible printed circuit board 301, but the antenna connecting structure 300 may include a printed circuit board formed of an inflexible material. In addition, a partial region of the antenna connecting structure 300 may have a printed circuit board formed of a flexible material and a partial region thereof may have a printed circuit board formed of an inflexible material.

Figure 4A:
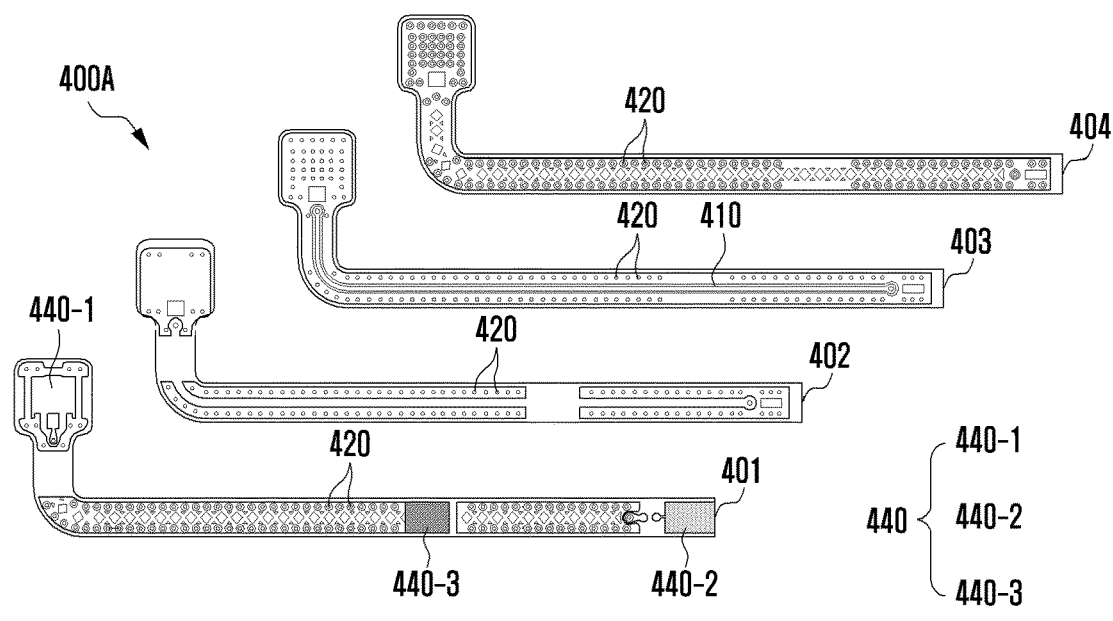
FIG. 4A is a diagram illustrating a multi-layer structure of a flexible printed circuit board according to various embodiments.
Figure 4A:
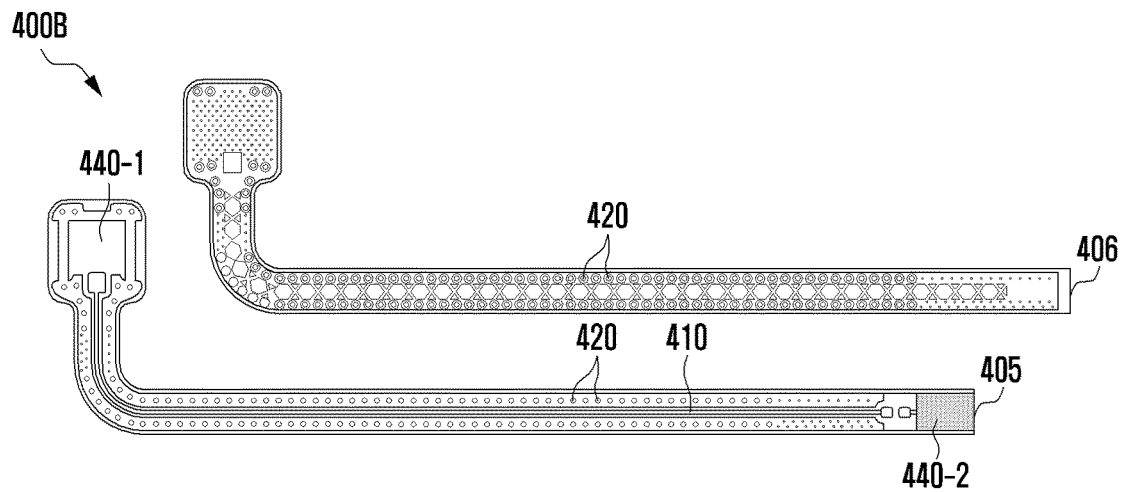
Figure 4B:
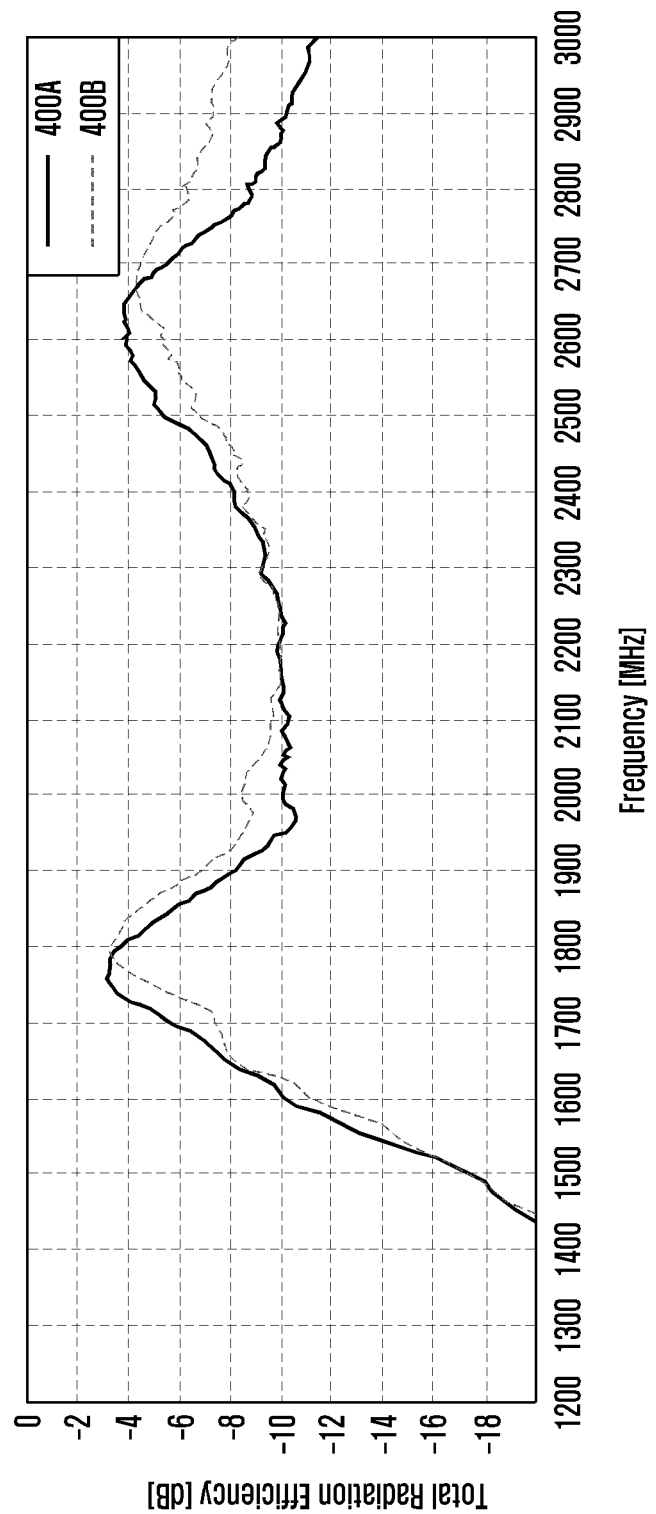
FIG. 4B is a graph illustrating the performance according to the structure of the flexible printed circuit board illustrated in FIG. 4A according to various embodiments.

FIG. 4A is a diagram illustrating example multi-layer structures of a flexible printed circuit board according to various embodiments. FIG. 4B is a graph illustrating the performance according to the structure of the flexible printed circuit board illustrated in FIG. 4A according to various embodiments. The flexible printed circuit board illustrated in FIG. 4A and FIG. 4B may be one of various examples of the flexible printed circuit board included in the antenna connecting structure described in FIG. 2 and FIG. 3A.

According to various embodiments, a flexible printed circuit board 400A and 400B may include a plurality of layers. For example, the flexible printed circuit board 400A may include four layers 401, 402, 403, and 404 as illustrated in FIG. 4A, and the flexible printed circuit board 400B may include two layers 405 and 406 as illustrated in FIG. 4A.

Referring to circuit board 400A of FIG. 4A, a conductive pad 440 may be disposed on one 401 of layers of the flexible printed circuit board 400A. The conductive pad 440 may include, for example, a first pad 440-1, a second pad 440-2, and a third pad 440-3. The first pad 440-1 may be electrically connected to the first connector (e.g., the first connector 310 in FIG. 3A) for connecting the flexible printed circuit board 400A and the main board of the electronic device. The second pad 440-2 may be electrically connected to the first frame (e.g., the first frame 304 in FIG. 3C) of the electronic device, which is formed of a conductive material. The second pad 440-2 may be electrically connected to the first frame of the electronic device by the second connector (e.g., the second connector 320 in FIG. 3A). The third pad 440-3 may be electrically connected to the ground via 420 of the flexible printed circuit board 400A. The third pad 440-3 may be electrically connected to the ground of the electronic device by the connecting member. The connecting member for connecting the third pad 440-3 to the ground of the electronic device may have a similar form to the connecting member (e.g., the second connector 320 in FIG. 3A) for connecting the second pad 440-2 to the first frame of the electronic device.

Referring to 400B of FIG. 4A, the conductive pad 440 may be disposed on one 405 of layers of the flexible printed circuit board 400B. The conductive pad 440 may include, for example, the first pad 440-1 and the second pad 440-2. The first pad 440-1 may be electrically connected to the first connector (e.g., the first connector 310 in FIG. 3A) for connecting the flexible printed circuit board 400B and the main board of the electronic device. The second pad 440-2 may be electrically connected to the first frame (e.g., the first frame 304 in FIG. 3C) of the electronic device, which is formed of a conductive material. The second pad 440-2 may be electrically connected to the first frame of the electronic device by the second connector (e.g., the second connector 320 in FIG. 3A).

According to various embodiments, at least one signal line 410 may be disposed on at least one layer (e.g., the layer 403 in (a) of FIG. 4A or the layer 405 in (b) of FIG. 4A) of a plurality of layers. An RF signal may be transmitted through the signal line 410. The ground via 420 may be disposed around the signal line 410. The ground via 420 may be provided in a vertical direction to the extending direction of the signal line 410 to be connected to the ground. The ground via 420 may extend through the plurality of layers. The ground via 420 disposed around the signal line 410 may block the RF signal transmitted to the signal line 410. The ground via 420 may reduce an effect, on the signal line 410, of the electromagnetic waves which may be emitted from the electronic components arranged to be adjacent to the flexible printed circuit board 400.

The radiation efficiency of the antenna connecting structure may vary depending on the layer structure of the flexible printed circuit board. Referring to FIG. 4B, it can be seen that, in an approximately 1800 MHz to approximately 2100 MHz band, the radiation efficiency of the antenna connecting structure including the flexible printed circuit board 400B including two layers is higher than the radiation efficiency of the antenna connecting structure including the flexible printed circuit board 400A including four layers, and, in an approximately 2200 MHz to approximately 2700 MHz band, the radiation efficiency of the antenna connecting structure including the flexible printed circuit board 400A including four layers is higher than the radiation efficiency of the antenna connecting structure including the flexible printed circuit board 400B including two layers. The number of layers of the flexible printed circuit board may be changed depending on the frequency band in which the antenna connecting structure mainly transmits or receives.

Figure 5A:
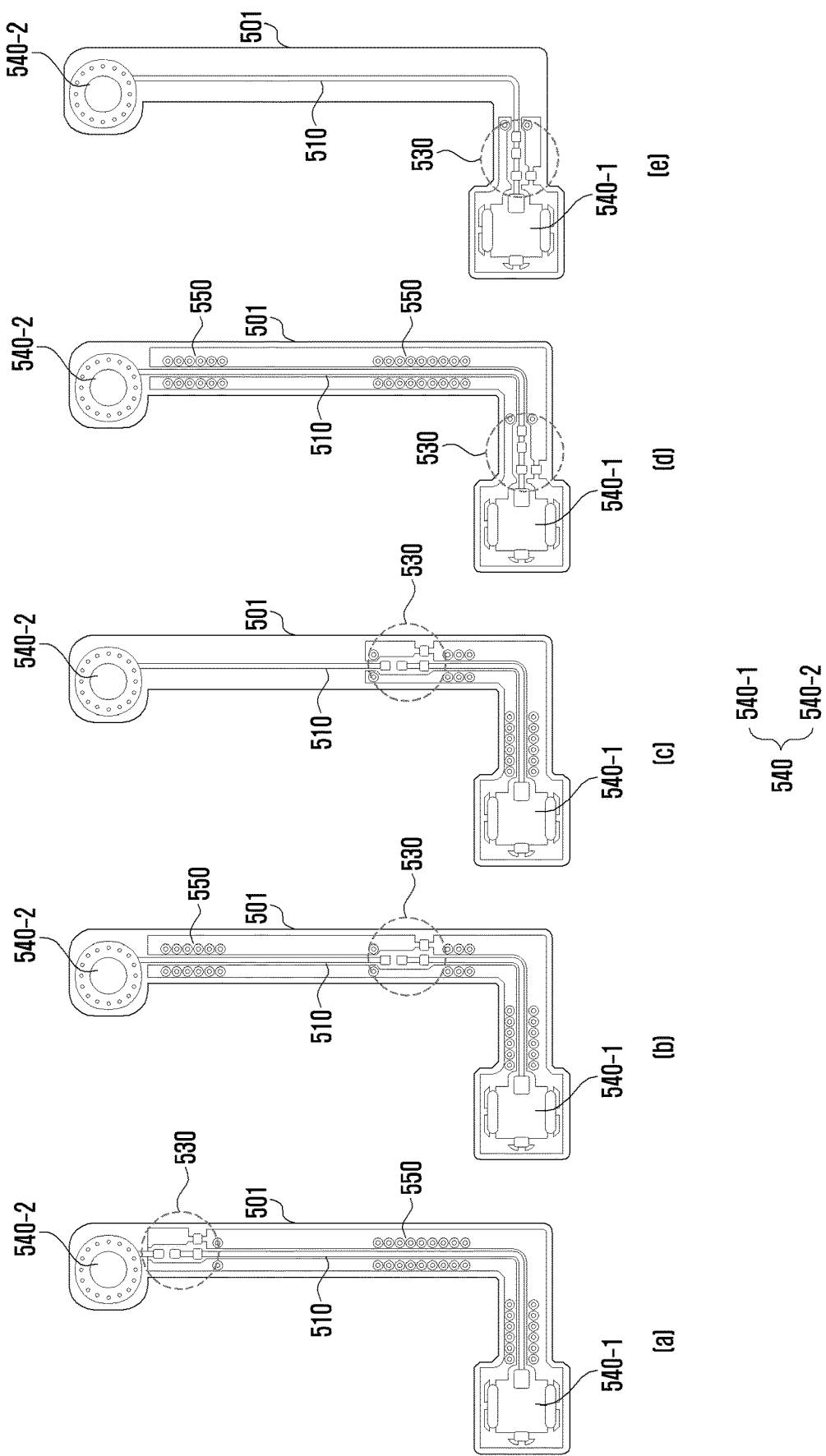
FIG. 5A is a view illustrating a flexible printed circuit board according to various embodiments disclosed herein.
Figure 5B:
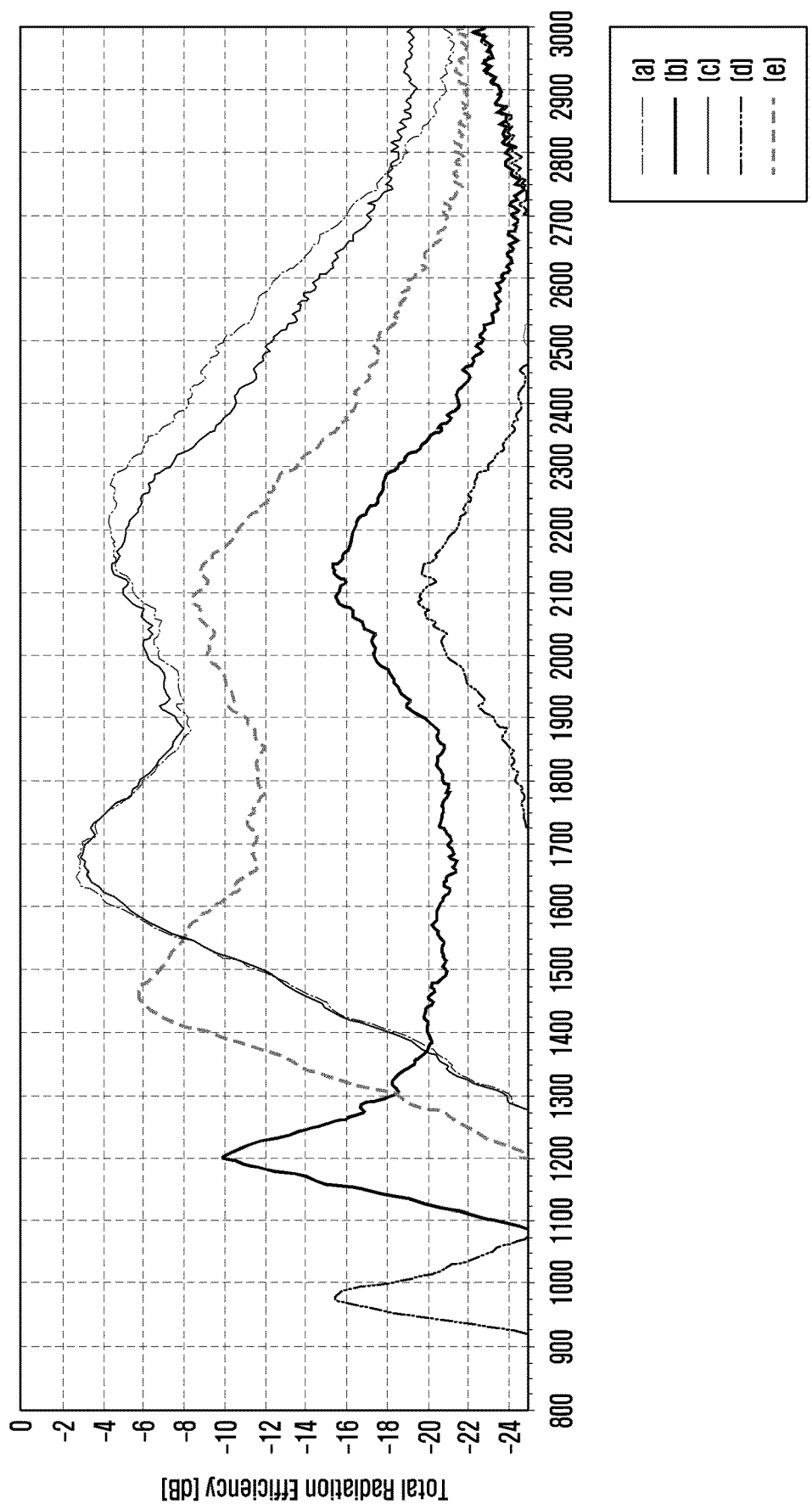
FIG. 5B is a diagram illustrating the performance of the antenna connecting structure including the flexible printed circuit board according to the various embodiments illustrated in FIG. 5A.

FIG. 5A is a diagram illustrating example flexible printed circuit boards according to various embodiments. FIG. 5B is a graph the performance of the antenna connecting structure including the flexible printed circuit board according to the various embodiments illustrated in FIG. 5A. Various flexible printed circuit boards illustrated in FIG. 5A may be various examples of the flexible printed circuit board included in the antenna connecting structure described in FIG. 2 and FIG. 3A.

Referring to (a) of FIG. 5A, a conductive pad 540 may be disposed on a flexible printed circuit board 501. The conductive pad 540 may include, for example, a first pad 540-1, and a second pad 540-2. The first pad 540-1 may be electrically connected to the first connector (e.g., the first connector 310 in FIG. 3A) for connecting the flexible printed circuit board 501 and the main board of the electronic device. The second pad 540-2 may be electrically connected to the frame (e.g., the frame 304 in FIG. 3C) of the electronic device, which is formed of a conductive material. The second pad 540-2 may be electrically connected to the frame of the electronic device by the second connector (e.g., the second connector 320 in FIG. 3A). In some cases, the second pad 540-2 has an opening formed therein, a bolt is inserted in the opening formed in the second pad 540-2, and then the bolt is bolt-coupled to a screw groove formed in the frame of the electronic device so that the second pad 540-2 and the frame of the electronic device are electrically connected to each other.

According to various embodiments, a signal line 510 for transmitting an RF signal and a ground via 550 disposed around the signal line 510 may be arranged on the flexible printed circuit board 501. The signal line 510 may electrically connect the first pad 540-1 and the second pad 540-2. The components described above are substantially same as the previously described components and thus the detailed description may not be repeated here.

The distance between the second pad 540-2 and a matching circuit 530 or the arrangement of the ground via 550 of the flexible printed circuit board 501 is variously changed. Referring to FIG. 5A, (a) corresponds to a case in which the second pad 540-2 is disposed to be spaced approximately 0.5 mm apart from the matching circuit 530, (b) corresponds to a case in which the second pad 540-2 is disposed to be spaced approximately 9 mm apart from the matching circuit 530, (c) corresponds to a case in which the second pad 540-2 is disposed to be spaced approximately 9 mm apart from the matching circuit 530 in the same manner as in (b) and the ground via 550 is not disposed between the second pad 540-2 and the matching circuit 530, (d) corresponds to a case in which the second pad 540-2 is disposed to be spaced approximately 16 mm apart from the matching circuit 530, and (e) corresponds to a case in which the second pad 540-2 is disposed to be spaced approximately 16 mm apart from the matching circuit 530 in the same manner as in (d) and the ground via 550 is not disposed between the second pad 540-2 and the matching circuit 530.

Referring to FIG. 5B, it can be seen that the radiation efficiency in a case of (a) in an approximately 1600 MHz to approximately 2800 MHz band is the greatest. Comparing (b) and (c), it can be seen that the radiation efficiency in a case of (c) in which the ground via 550 is not present between the second pad 540-2 and the matching circuit 530 is greater than in a case of (b). In addition, comparing (d) and (e), it can also be seen that the radiation efficiency in a case of (e) in which the ground via 550 is not present between the second pad 540-2 and the matching circuit 530 is greater than in a case of (d). Through these experimental results, it can be seen that it is a design element improving the radiation efficiency that the second pad 540-2 and the matching circuit 530 are arranged to be adjacent to each other and the ground via 550 is not disposed between the second pad 540-2 and the matching circuit 530. Therefore, when designing the antenna connecting structure disclosed herein, the matching circuit 530 may be disposed adjacent to the second pad 540-2, and the ground via 550 may not be disposed between the matching circuit 530 and the second pad 540-2.

Figure 6A:
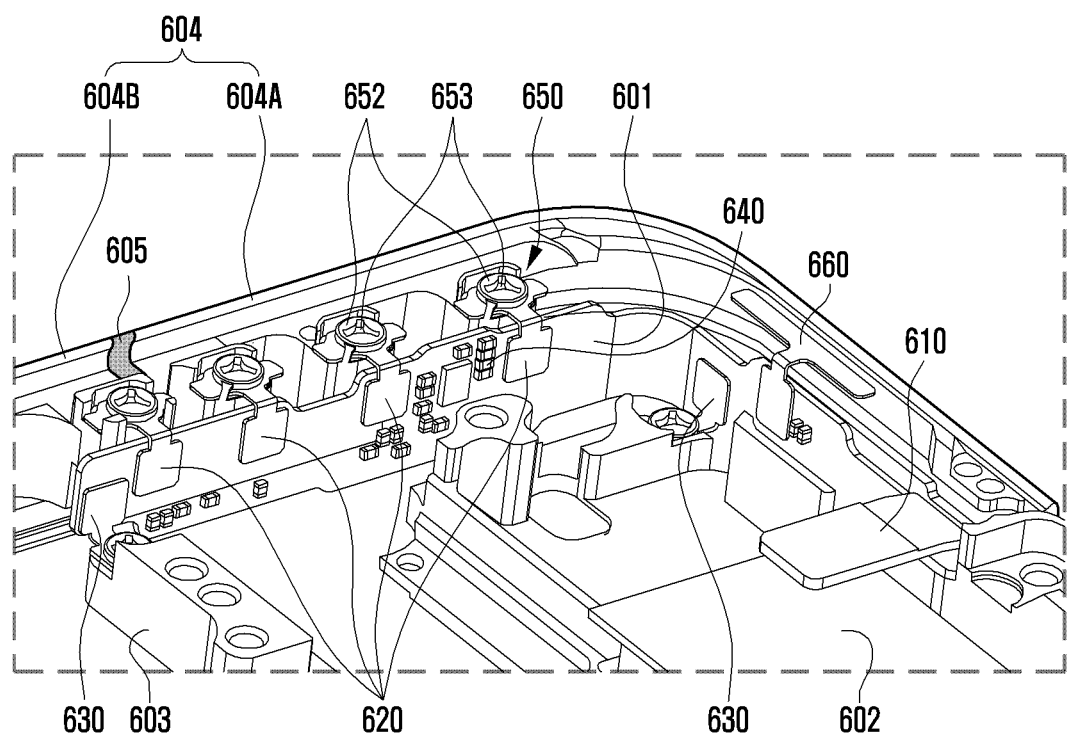
FIG. 6A is a perspective view illustrating an antenna connecting structure and a portion of an electronic device to which the antenna connecting structure is coupled according to various embodiments.
Figure 6A:
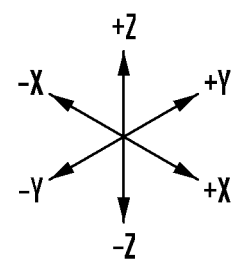
Figure 6B:
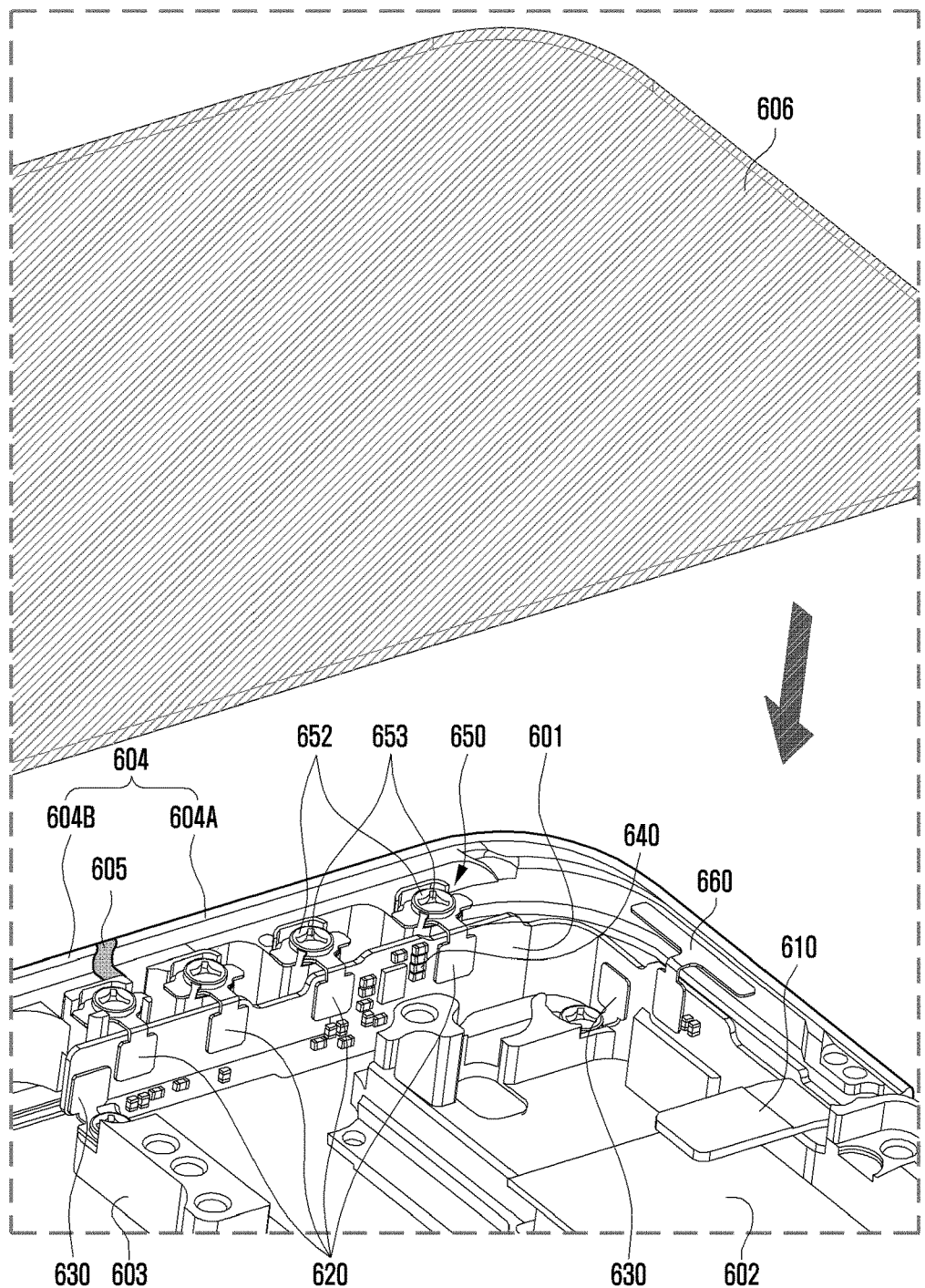
FIG. 6B is an exploded perspective view of a plate of an electronic device according to various embodiments.
Figure 6C:
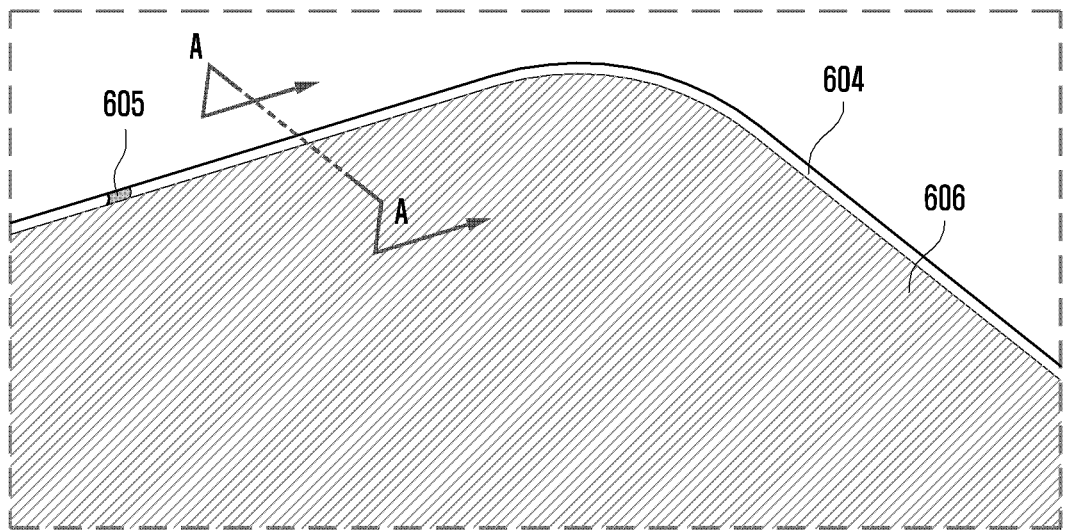
FIG. 6C is a diagram illustrating an electronic device coupled to a plate according to various embodiments.

FIG. 6A is a perspective view illustrating an example antenna connecting structure according to various embodiments and a portion of an electronic device to which the antenna connecting structure is coupled. FIG. 6B is an exploded perspective view of a plate of an electronic device according to various embodiments. FIG. 6C is a diagram illustrating an electronic device coupled to a plate. The antenna connecting structure and the electronic device illustrated in FIG. 6A, 6B and FIG. 6C may be embodiments similar to the antenna connecting structure and the electronic device illustrated in FIG. 3B.

The antenna connecting structure according to various embodiments disclosed herein may include a flexible printed circuit board (FPCB) 601, a first connector 610, a second connector 620, a third connector 630, and an integrated circuit 640. The component of the antenna connecting structure mentioned above is a merely example, and one of the described components may be omitted or another component except the described components may be included in the antenna connecting structure.

According to various embodiments, the flexible printed circuit board 601 may be a board formed of a flexible material and having a signal line (e.g., the signal line 410 in FIG. 4A) disposed thereon. The flexible printed circuit board 601 can be disposed in a narrow space, unlike a general printed circuit board formed of a less flexible material, and have a high degree of freedom of manufacturing in terms of a shape. Therefore, the flexible printed circuit board 601 can have an advantage of being disposed in a narrow space inside the electronic device. For example, as illustrated in FIG. 6A, the flexible printed circuit board 601 may be manufactured in a shape in which the flexible printed circuit board can be disposed in a space between electronic components or instruments disposed in the electronic device. The flexible printed circuit board 601 may be bent and thus may be disposed on a surface having a stepped portion. The flexible printed circuit board 601 may be a base of the antenna connecting structure disclosed herein, and thus various components may be coupled or connected to the flexible printed circuit board 601.

According to various embodiments, the first connector 610 may electrically connect the flexible printed circuit board 601 and a main board 602 of the electronic device. The main board 602 of the electronic device may include a board having a communication module (e.g., the communication module 190 in FIG. 1) disposed thereon, or a board electrically connected to the board having a communication module disposed thereon. The first connector 610 may electrically connect the flexible printed circuit board 601 and the main board 602 in various ways. The first connector 610 may connect the flexible printed circuit board 601 and the main board 602 using an electrically connecting method, such as soldering, clipping, socketing, bolting, and/or bonding. For example, the first connector 610 may be a connector having a form in which a socket can be inserted. The RF signal generated by the communication module disposed in the main board 602 may be transmitted to the flexible printed circuit board 601 through the first connector 610.

According to various embodiments, the second connector 620 may electrically connect the flexible printed circuit board 601 and a first frame 604 of the electronic device. At least a portion of the first frame 604 of the electronic device may be exposed to the outside of the electronic device and may be formed of a metal material. The first frame 604 formed of a metal material may function as an antenna for transmitting or receiving an RF signal. The second connector 620 may be at least partially bent. The second connector 620 may be partially deformed depending on an arrangement relation between the first frame 604 and the flexible printed circuit board 601. The second connector 620 may be formed in a shape which can electrically connect the first frame 604 and the flexible printed circuit board spaced apart therefrom. The first frame 604 and the flexible printed circuit board 601 may be connected to each other by the second connector 620 in the form where a portion thereof can be deformed, thereby improving the degree of freedom of an arrangement of the flexible printed circuit board 601.

According to various embodiments, a bolt member (e.g., bolt) 650 inserted in a groove (e.g., a groove 620-1 in FIG. 7) formed in the second connector 620 is bolt-coupled to a bolt groove (e.g., a bolt groove 604-1 in FIG. 7) provided at the first frame 604 so that the second connector 620 can be connected to the first frame 604. The bolt member 650 may include a bolt body (e.g., a bolt body 651 in FIG. 7) inserted in the bolt groove formed in the first frame 604 and a bolt head 652 formed integrally with the bolt body. An assembly groove 653 for assembly of the bolt member 650 may be formed at the bolt head 652. A shape of the assembly groove 653 may be variously changed into, for example, a cross (+) shape, a line (–) shape, a Y-shape, a star-shape, a quadrangle, a triangle, a hexagon, and the like.

Figure 7A:
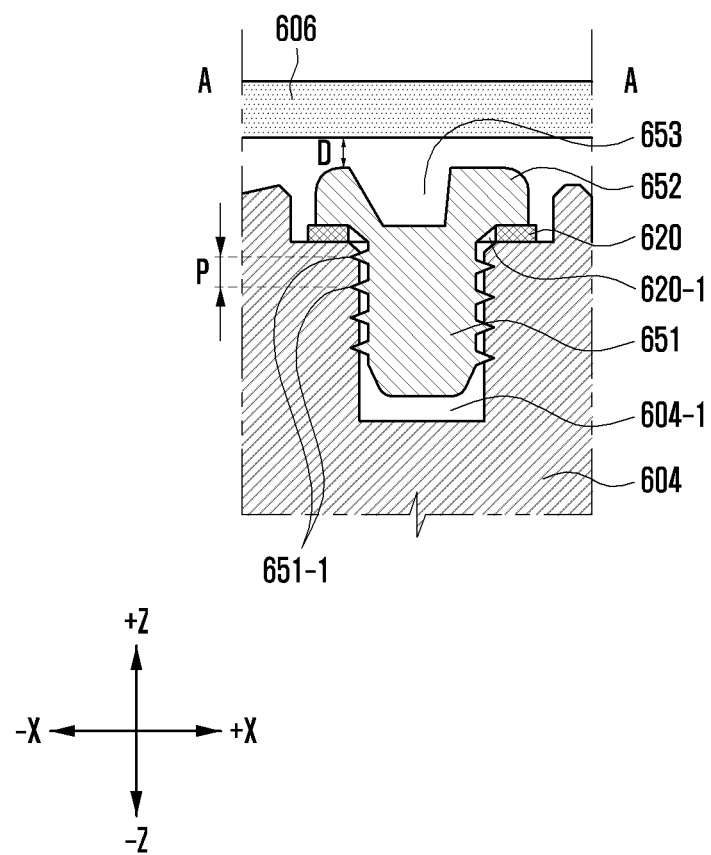
FIGS. 7A and 7B are cross-sectional views of the electronic device illustrated in FIG. 6C, taken along line A-A according to various embodiments.
Figure 7B:
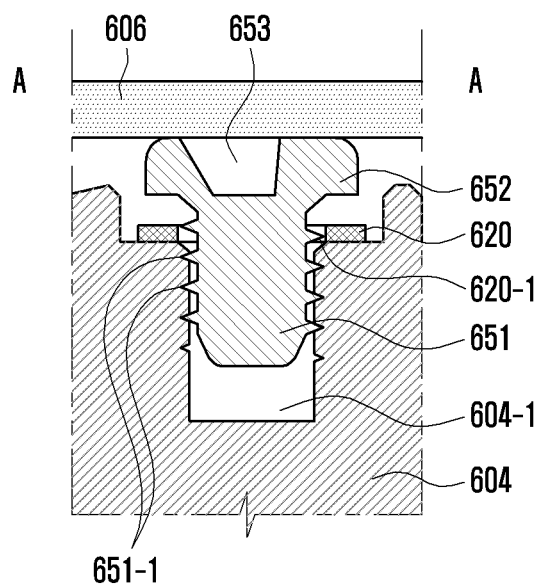
Figure 7B:
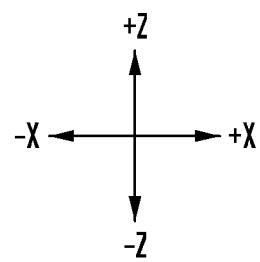

According to various embodiments, the bolt groove provided at the first frame 604 may be formed in a direction parallel to a first direction (e.g., +Z direction in FIG. 6A) (see FIG. 7). When the bolt member 650 is bolt-coupled to the bolt groove, the bolt head 652 of the bolt member 650 may be disposed in the first direction with respect to the first frame 604.

According to various embodiments, as illustrated in FIG. 6B, the plate 606 may be coupled to the first frame 604 in the first direction. When the plate 606 is coupled to the first frame 604 in the first direction, the plate and the bolt head 652 of the bolt member 650 may face each other (see FIG. 7). The movement of the bolt member 650 may be restricted by the plate 606 disposed to be adjacent to the bolt head 652 of the bolt member 650. Even when impact is applied to the electronic device and the bolt body partially rotates with respect to the bolt groove, the plate 606 disposed to be adjacent to the bolt head 652 may restrict the movement of the bolt member 650. Therefore, the coupling of the second connector 620 and the first frame 604 by the bolt member 650 can be maintained in spite of the external impact.

According to various embodiments, as illustrated in FIG. 6A, there may be the plurality of second connectors 620. The plurality of the second connectors 620 may be respectively connected to a first area 604A and a second area 604B of the first frame 604 segmented by an insulating material 605. Some of the plurality of second connectors 620 may be connected to the first area 604A of the first frame 604 and the others of the second connectors 620 may be connected to the second area 604B of the first frame 604.

According to various embodiments, the first area 604A and the second area 604B which are segmented from each other may be used as an antenna for transmitting or receiving a communication signal. For example, an RF signal may be transferred to the first area 604A through the second connector 620 connected to the first area 604A to allow the RF signal to be transmitted through the first area 604A, and an RF signal may be transferred to the second area 604B through the second connector 620 connected to the second area 604B to allow the RF signal to be transmitted through the second area 304B. While the first area 604A and/or the second area 604B function as an antenna, the third connector 630 connected to a second frame 603 functions as a ground so that the first area 604A and/or the second area 604B can be a planar inverted f antenna (PIFA). The first area 604A and the second area 604B may be short-circuited to each other by the switching circuit included in the integrated circuit 640 of the flexible printed circuit board.

According to various embodiments, the third connector 630 may electrically connect the flexible printed circuit board 601 and the second frame 603. The third connector 630 may be formed at least partially bendable in a manner similar to the second connector 620. The third connector 630 and the second frame 603 may be connected to each other by the bolt-coupling. The second frame 603 may be a frame disposed in the electronic device. The third connector 630 may be connected to the second frame 603 so that the ground of the flexible printed circuit board 601 can be enhanced. Since the second frame 603 occupies a large area in the electronic device, the second frame can function as a stable ground. The third connector 630 may connect the flexible printed circuit board 601 to the second frame 603 to enhance the ground of the flexible printed circuit board 601. As a result, the performance of the antenna of the first frame 604 electrically connected to the flexible printed circuit board 601 to perform an antenna function can be improved. The third connector 630 may be formed of a material (e.g., a metal material) having hardness higher than that of the flexible printed circuit board 601. Therefore, the third connector 630 may be disposed in a portion where the flexible printed circuit board 601 is difficult to be disposed. For example, the shape of the third connector 630 may be freely changed depending on the shape of the peripheral configuration. The flexible printed circuit board 601 may be connected to the second frame 603 through the third connector 630 rather than directly connected so that the electrical connection state between the flexible printed circuit board 601 and the second frame 603 can be stably maintained.

According to various embodiments, the integrated circuit 640 may be disposed on the flexible printed circuit board 601. The integrated circuit 640 may include, for example, various antenna-related circuit such as a matching circuit for impedance matching and a switching circuit for allowing the antenna connecting structure to correspond to wideband characteristics. For example, the switching circuit short-circuits (short) the antennas electrically opened to each other to increase the physical length of the antenna. The matching circuit which may be included in the integrated circuit 640 may be disposed on the flexible printed circuit board 601 adjacent to the first frame 604 for performing an antenna function in the electronic device. Since the matching circuit is disposed at the position adjacent to the first frame 604, the loss of the RF signal can be reduced.

According to various embodiments, the flexible printed circuit board 601 may include at least one antenna radiator 660 formed of a conductive material and electrically connected to the flexible printed circuit board 601. The antenna radiator 660 may be, for example, an antenna for transmitting or receiving a high-frequency RF signal (Ghz frequency or higher). At least a portion of the antenna radiator 660 may be supported by the first frame 604. The antenna radiator 660 may transmit and receive a communication signal mainly in the first direction. For example, as illustrated in FIG. 6A, a main surface (a portion having a large area) of the antenna radiator 660 may be disposed to be oriented in the first direction. In some cases, a portion of the antenna radiator 660 connected to the flexible printed circuit board 601 may be exposed to the outside of the electronic device. The matching circuit may be disposed at the position adjacent to the antenna radiator 660. The shape of the antenna radiator 660 may be variously changed not to be limited to the shape illustrated in FIG. 6A.

According to various embodiments, the antenna radiator 660 may include a metal material (e.g., stainless (SUS), aluminum, copper, and/or iron). For example, the antenna radiator 660 may be formed of stainless to be electrically connected to the flexible printed circuit board 601.

Figure 8A:
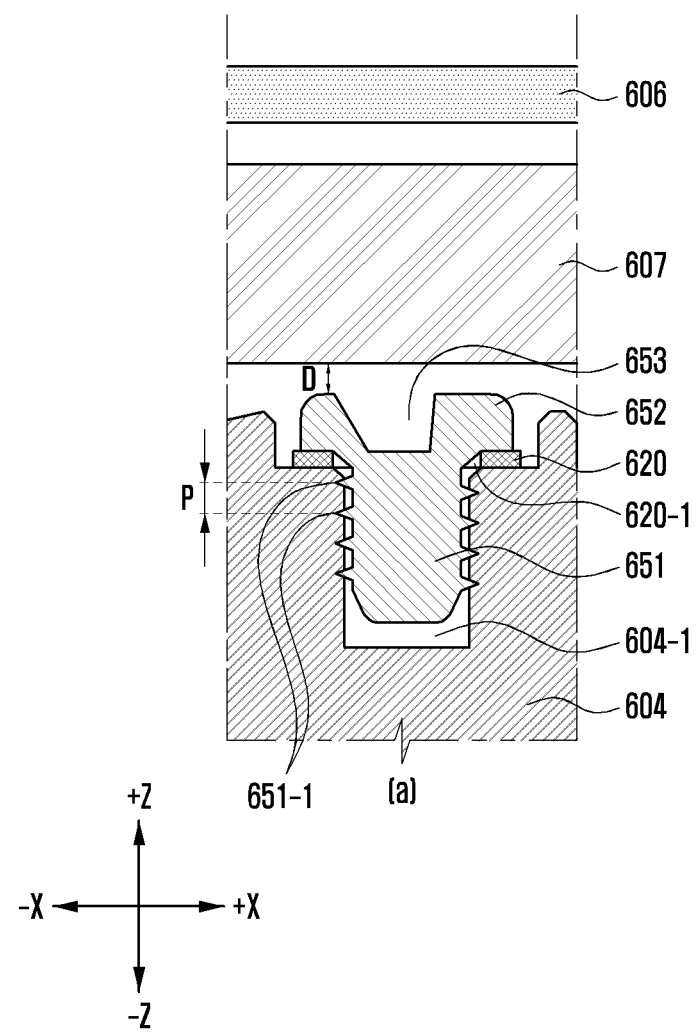
FIGS. 8A and 8B are cross-sectional views of an electronic device including an outer plate and an inner plate according to various embodiments.
Figure 8B:
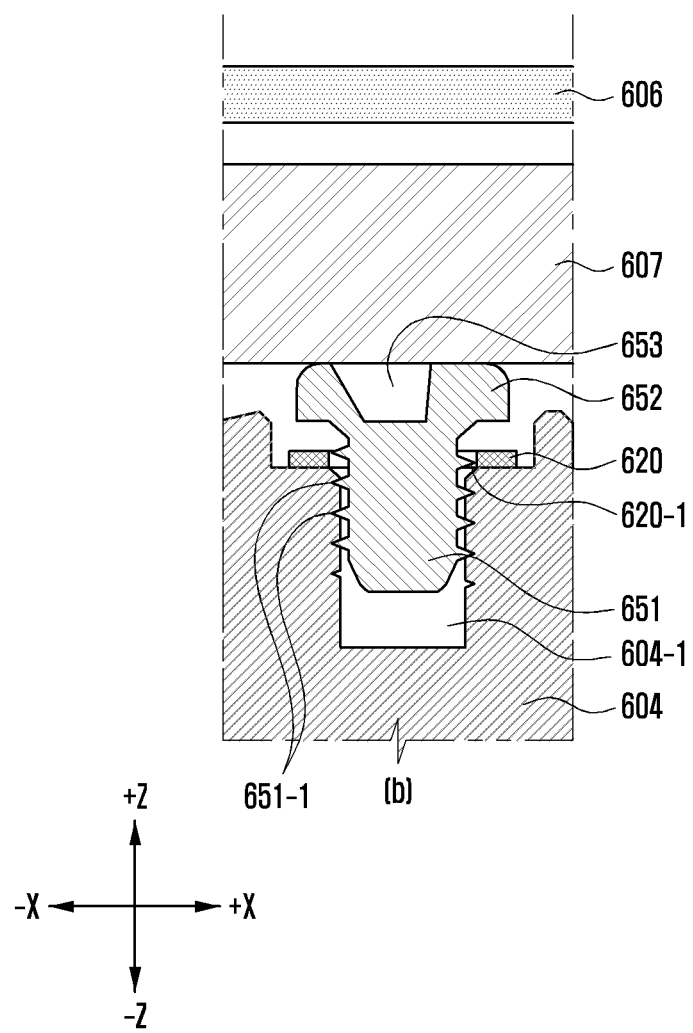

FIGS. 7A and 7B are cross-sectional views of the view illustrated in FIG. 6C, taken along line A-A according to various embodiments. FIGS. 8A and 8B are cross-sectional views of an electronic device including an outer plate and an inner plate according to various embodiments. In the following description, the components identical or similar to the configuration illustrated in FIG. 6A, 6B and FIG. 6C may use the same reference numerals and the detailed description thereof may not be repeated here.

According to various embodiments, the bolt member (e.g., bolt) 650 may bolt-couple the second connector 620 to the first frame 604. The bolt member 650 may pass through the groove 620-1 formed at the second connector 620 so that the bolt body 651 of the bolt member 650 is inserted in the bolt groove 604-1 formed at the first frame 604. The bolt body 651 of the bolt member 650 may have a screw line 651-1 spirally formed on the outer surface thereof. The distance between adjacent screw lines 651-1 may be defined as a pitch (P). When the bolt body 651 has rotated once, the pitch (P) may be identical to the distance by which the bolt member 650 moves with respect to the bolt groove 604-1. The bolt head 652 formed integrally with the bolt body 651 may be disposed in the first direction (e.g., +Z direction in FIG. 7) of the first frame 604.

According to various embodiments, the plate 606 may be coupled to the first frame 604 in the first direction. The plate 606 may be, for example, an outer plate 606 in which at least part of the surface is exposed to the outside of the electronic device. In addition, as illustrated in FIGS. 8A and 8B, the plate 606 may be an inner plate 607 disposed in the electronic device. As illustrated FIGS. 8A and 8B, the inner plate 607 may be disposed between the outer plate 606 and the first frame 604.

According to various embodiments, the distance (D) between the bolt head 652 disposed in the first direction of the first frame 604 and the plate 606 coupled to the first frame 604 in the first direction may be larger than approximately 0.1 μm in consideration of an assembly margin. The distance (D) between the bolt head 652 and the plate 606 may be identical to or smaller than the pitch (P) (e.g., 0.3 mm) corresponding to the interval of the screw line formed on the bolt body of the bolt member 650. In some cases, the distance (D) between the bolt head 652 and the plate 606 may be identical to or smaller than twice the pitch (P). Accordingly, the bolt member 650 cannot be loosened by two or more turns. For example, in a case where the distance (D) between the bolt head 652 and the plate 606 is the same as twice the pitch (P) corresponding to the interval between the screw lines formed on the bolt body of the bolt member 650, when the bolt member 650 rotates twice to move back to the bolt groove 604-1, as illustrated in FIG. 7B, the bolt head 652 may come into contact with the plate 606. The bolt member 650 cannot be loosened any more in the state illustrated in FIG. 7B. Even when an impact is applied to the electronic device and thus the bolt body 651 partially rotates in the bolt groove 604-1, the bolt head 652 is interfered the plate 606 and thus the bolt member 650 cannot be completely separated from the bolt groove 604-1. Therefore, the bolt member 650 may allow the second connector 620 to be maintained in a state of being coupled to the first frame 604. According to various embodiments disclosed herein, even when an impact is applied to the electronic device by various factors, the bolt member 650 is not loosened by the level in which the bolt member is separated from the bolt groove 604-1 and thus the coupling of the first frame 604 and the second connector 620 may be stably maintained.

According to various embodiments, the distance (D) between the bolt head 652 disposed in the first direction of the first frame 604 and the plate 606 coupled to the first frame 604 in the first direction may vary. For example, when the bolt head may be disposed to be spaced at least predetermined distance (D) (e.g., 0.1 μm) apart from the plate 606 and the assembly tolerance (e.g., 01 μm) occurs, the bolt head 652 may be in contact with the plate 606.

Referring to FIGS. 8A and 8B, the movement of the bolt member 650 may be restricted by the inner plate 607. Similar to the view illustrated in FIGS. 7A and 7B, the distance (D) between the inner plate 607 and the bolt member 650 may be smaller than the pitch (P) of the bolt member 650. Therefore, the bolt member 650 is not loosened by the level where the bolt member can be separated from the bolt groove 640-1 and thus the coupling of the first frame 604 and the second connector 620 may be stably maintained.

Figure 9:
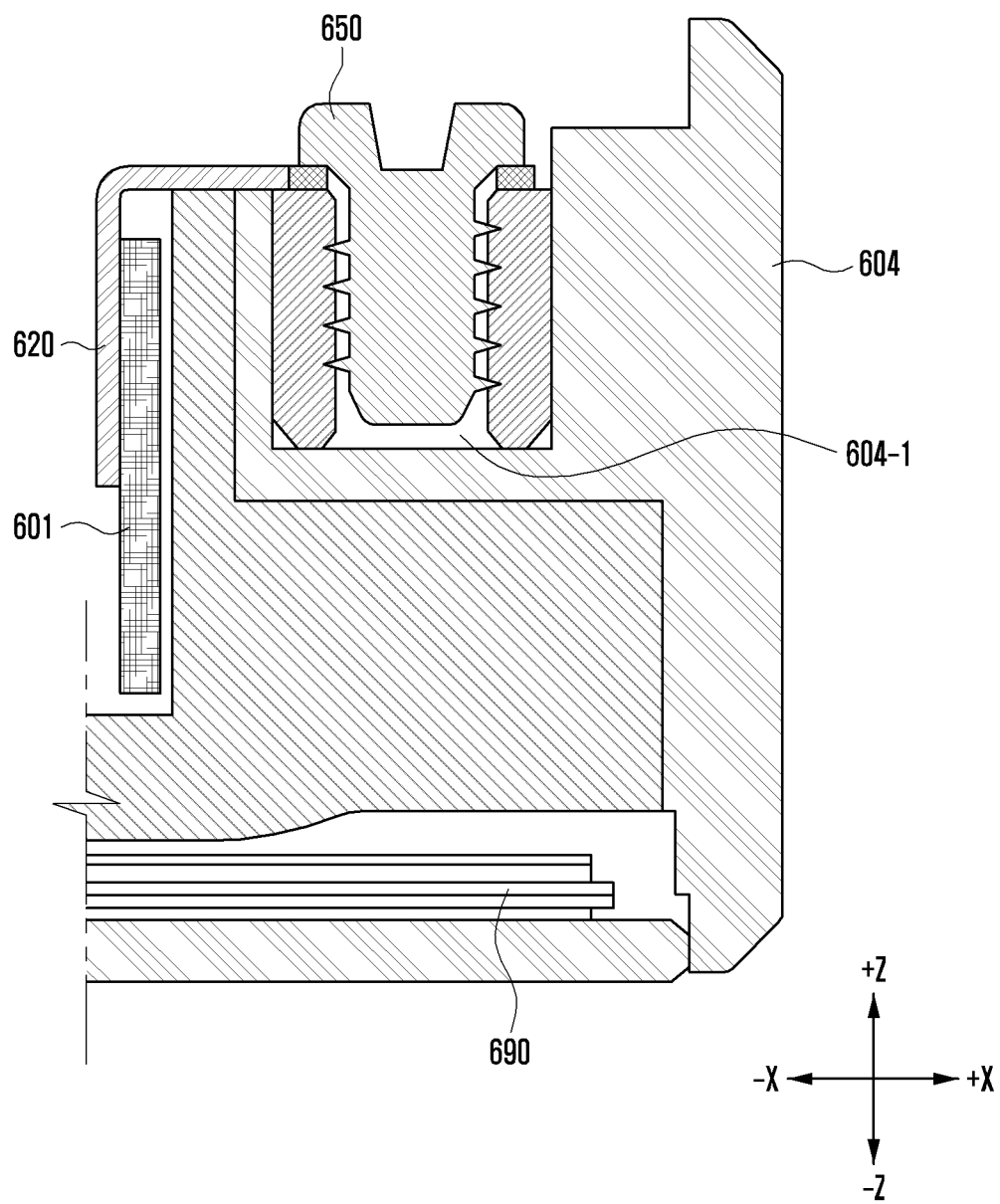
FIG. 9 is a cross-sectional view illustrating a distance between a display of an electronic device and a bolt according to various embodiments.

FIG. 9 is a cross-sectional view illustrating an example distance between a display of the electronic device and the bolt member 650 according to various embodiments. In the following description, the components identical or similar to the configuration illustrated in FIG. 6A to FIG. 6C may use the same reference numerals and the detailed description thereof may not be repeated here.

According to various embodiments, the bolt member 650 may be inserted in the bolt groove 604-1 formed in the first frame 604. The bolt groove 604-1 formed in the first frame 604 may be formed in a direction parallel to the first direction (e.g., +Z direction in FIG. 9).

According to various embodiments, a display 690 (e.g., the display module 160 in FIG. 1) may be coupled to the first frame 604 in a second direction (e.g., −Z direction in FIG. 9) opposite to the first direction.

As illustrated in FIG. 9, even when the bolt member 650 is inserted in the bolt groove 604-1, the bolt member 650 and the display 690 may be spaced a sufficient distance apart from each other. Therefore, the influence on the bolt member 650 due to the operation signal of the display 690 may be reduced. Therefore, the RF signal transmitted to the bolt member 650 can maintain the determined quality.

An electronic device according to various example embodiments may include: a first frame at least partially exposed to an outside of the electronic device and comprising a metal material, a flexible printed circuit board at least a portion of which is disposed adjacent to the first frame, a first connector electrically connecting the flexible printed circuit board and a main board of the electronic device, a bendable second connector electrically connecting the flexible printed circuit board and the first frame, a bolt including a bolt body extending through a groove formed in the second connector to be bolt-coupled to a bolt groove formed in the first frame and a bolt head formed integrally with the bolt body and disposed in a first direction with respect to the first frame, a plate disposed adjacent to the bolt head of the bolt member and coupled to the first frame in the first direction to allow the bolt body of the bolt member to be maintained in a state of being coupled to the bolt groove formed in the first frame, and an integrated circuit disposed on the flexible printed circuit board.

The distance between the bolt head of the bolt member and the plate may be in a range of at least 0.1 μm and a pitch corresponding to an interval of a screw line provided on the bolt body of the bolt member.

The distance between the bolt head of the bolt member and the plate may be in a range of at least 0.1 μm and twice the pitch corresponding to the interval of the screw line provided on the bolt body of the bolt member.

The plate may comprise an outer plate at least a portion of which is exposed to the outside of the electronic device.

The plate may comprise an inner plate disposed in the electronic device.

The electronic device may further include a second frame disposed in the electronic device and a bendable third connector electrically connecting the flexible printed circuit board and the first frame.

At least a portion of the flexible printed circuit board may be supported by the second frame.

The flexible printed circuit board may be formed in a shape in which the flexible printed circuit board can be disposed in the space between the main board and the first frame.

The flexible printed circuit board may include a first area in which the first connector and the second connector are positioned, and at least one second area branched and extending from the first area, and the at least one second area of the flexible printed circuit board may comprise an additional antenna for transmitting or receiving an RF signal.

The flexible printed circuit board may include at least one additional antenna formed of a conductive material and electrically connected to the flexible printed circuit board configured to transmit and/or receive an RF signal.

The first frame may be segmented into a plurality of areas including a first area and a second area by an insulating material disposed therebetween.

The plurality of the second connectors may be provided, at least one of the plurality of second connectors may electrically connect the first area of the first frame and the flexible printed circuit board, and at least one of the plurality of second connectors may electrically connect the second area of the first frame and the flexible printed circuit board.

The flexible printed circuit board may include a plurality of layers, a signal line configured to transmit an RF signal may be disposed on at least one of the plurality of layers, and a ground via extending through the plurality of layers may be disposed around the signal line.

The integrated circuit may include a matching circuit configured to provide impedance matching, and the matching circuit may be disposed at the part adjacent to the part in which the second connector and the flexible printed circuit board are connected to each other.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a first frame at least partially exposed to an outside of the electronic device and comprising a metal material;
   a flexible printed circuit board, at least a portion of which is disposed adjacent to the first frame;
   a first connector electrically connecting the flexible printed circuit board and a main board of the electronic device;
   a bendable second connector electrically connecting the flexible printed circuit board and the first frame;
   a bolt comprising a bolt body extending through a groove formed in the second connector to be bolt-coupled to a bolt groove formed in the first frame and a bolt head formed integrally with the bolt body and disposed in a first direction with respect to the first frame;

a plate disposed adjacent to the bolt head of the bolt and coupled to the first frame in the first direction to allow the bolt body of the bolt to be maintained in a state of being coupled to the bolt groove formed in the first frame; and an integrated circuit disposed on the flexible printed circuit board.

2. The electronic device of claim 1, wherein a distance between the bolt head of the bolt and the plate is in a range of at least 0.1 μm and a pitch corresponding to an interval of a screw line provided on the bolt body of the bolt.

3. The electronic device of claim 1, wherein a distance between the bolt head of the bolt and the plate is in a range of at least 0.1 μm and twice a pitch corresponding to an interval of a screw line provided on the bolt body of the bolt.

4. The electronic device of claim 1, wherein the plate includes an outer plate at least a portion of which is exposed to the outside of the electronic device.

5. The electronic device of claim 1, wherein the plate includes an inner plate disposed in the electronic device.

6. The electronic device of claim 1, further comprising:
a second frame disposed in the electronic device; and
a bendable third connector electrically connecting the flexible printed circuit board and the first frame.

7. The electronic device of claim 6, wherein at least a portion of the flexible printed circuit board is supported by the second frame.

8. The electronic device of claim 1, wherein the flexible printed circuit board is formed in a shape in which the flexible printed circuit board can be disposed in the space between the main board and the first frame.

9. The electronic device of claim 1, wherein the flexible printed circuit board comprises a first area in which the first connector and the second connector are positioned, and at least one second area branched and extending from the first area, and the at least one second area of the flexible printed circuit board comprising an additional antenna configured to transmit and/or receive an RF signal.

10. The electronic device of claim 1, wherein the flexible printed circuit board comprises at least one additional antenna comprising a conductive material and electrically connected to the flexible printed circuit board configured to transmit and/or receive an RF signal.

11. The electronic device of claim 1, wherein the first frame is segmented into a plurality of areas comprising a first area and a second area separated by an insulating material disposed between the first area and the second area.

12. The electronic device of claim 11, wherein the electronic device comprises a plurality of second connectors, at least one of the plurality of second connectors electrically connecting the first area of the first frame and the flexible printed circuit board, and at least one of the plurality of second connectors electrically connecting the second area of the first frame and the flexible printed circuit board.

13. The electronic device of claim 1, wherein the flexible printed circuit board comprises a plurality of layers, a signal line configured to transmit an RF signal disposed on at least one of the plurality of layers, and a ground via extending through the plurality of layers disposed around the signal line.

14. The electronic device of claim 1, wherein the integrated circuit comprises a matching circuit configured to provide impedance matching, and the matching circuit is disposed at a part adjacent to the part in which the second connector and the flexible printed circuit board are connected to each other.

* * * * *